United States Patent
Yamakawa et al.

(10) Patent No.: US 8,570,112 B2
(45) Date of Patent: Oct. 29, 2013

(54) OSCILLATOR WITH MEMS RESONATOR

(75) Inventors: Takehiko Yamakawa, Osaka (JP); Tomohiro Iwasaki, Shiga (JP); Kunihiko Nakamura, Osaka (JP); Keiji Onishi, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/702,396

(22) PCT Filed: Jun. 8, 2012

(86) PCT No.: PCT/JP2012/003751
§ 371 (c)(1),
(2), (4) Date: Dec. 6, 2012

(87) PCT Pub. No.: WO2012/169205
PCT Pub. Date: Dec. 13, 2012

(65) Prior Publication Data
US 2013/0147567 A1   Jun. 13, 2013

(30) Foreign Application Priority Data
Jun. 9, 2011   (JP) .................................. 2011-129024

(51) Int. Cl.
*H03B 5/30*   (2006.01)

(52) U.S. Cl.
USPC .................. 331/154; 331/116 M; 331/116 R; 331/96; 331/175; 331/183

(58) Field of Classification Search
USPC ..................... 331/116 M, 116 R, 96, 175, 183
See application file for complete search history.

(56) References Cited

U.S. PATENT DOCUMENTS 6,741,137 B1   5/2004   Sibrai et al.
8,228,130 B1 *   7/2012   Ivanov et al. ............ 331/116 M (Continued)

FOREIGN PATENT DOCUMENTS

| JP | 2004-201320 | 7/2004 |
| JP | 2005-59128 | 3/2005 |
| JP | 2007-518351 | 7/2007 |
| JP | 2009-100009 | 5/2009 |
| JP | 2009-200888 | 9/2009 |

OTHER PUBLICATIONS

International Search Report issued Aug. 21, 2012 in International (PCT) Application No. PCT/JP2012/003751.

(Continued)

*Primary Examiner* — Arnold Kinkead
(74) *Attorney, Agent, or Firm* — Wenderoth, Lind & Ponack, L.L.P.

(57) ABSTRACT

A MEMS oscillator having a feedback-type oscillation circuit including a MEMS resonator and an amplifier, a voltage control unit operable to control a bias voltage applied to an oscillating member of the MEMS resonator, and an auto gain control unit which receives an output from the amplifier and, based on a level of the output, to output an amplitude control signal for controlling a gain of the amplifier to the amplifier such that the level of the output from the amplifier comes to be a predetermined level, wherein the voltage control unit controls the bias voltage applied to the oscillating member based on an operating temperature of the MEMS resonator such that a peak gain of the MEMS resonator comes to have a predetermined value regardless of the operating temperature, and the voltage control unit derives the operating temperature of the MEMS resonator by monitoring the amplitude control signal.

10 Claims, 16 Drawing Sheets

(56) References Cited

U.S. PATENT DOCUMENTS

| | | | |
|---|---|---|---|
| 8,451,071 B2* | 5/2013 | Clark et al. | 331/185 |
| 2005/0151592 A1 | 7/2005 | Partridge et al. | |
| 2009/0212877 A1 | 8/2009 | Ogasawara | |
| 2012/0182077 A1* | 7/2012 | Yamakawa et al. | 331/34 |

OTHER PUBLICATIONS

Written Opinion of the International Searching Authority issued Aug. 21, 2012 in International (PCT) Application No. PCT/JP2012/003751.

* cited by examiner (PRIOR ART)

OSCILLATOR WITH MEMS RESONATOR

TECHNICAL FIELD

The technical field relates to an oscillator and, more particularly, relates to an oscillator employing a micro electro-mechanical system resonator (MEMS resonator).

BACKGROUND ART

Conventionally, an oscillator has been utilized for providing timing (providing synchronization) for operations of circuits, in an electronic apparatus or the like. In such a case, the oscillator has been used as a device for outputting an electric signal (reference clock signal) which forms a reference for operations of circuits. In view of a stable operation of the electronic apparatus, such an oscillator has been desired to output a high-quality reference clock signal having a less phase noise.

Further, in a communication apparatus, an oscillator has been utilized as a device for creating a reference signal for signal transmission. Along with increased demands for speed-up of wireless communication and for sophistication of global positioning system (GPS), in recent years, the oscillator has been required to further improve the phase stability of an oscillation signal (to further reduce the phase noise).

An oscillator using a quartz crystal unit (quartz oscillator) is one example of current oscillators. However, such a quartz crystal unit has various problems that it is hard to reduce in size and is unsuitable for integration and, further, it involves larger numbers of trial production processes, a poor yield, and longer delivery times.

In recent years, attention has been focused on an oscillator employing, as a resonator, a micro electro-mechanical system (MEMS) formed from silicon or the like through a semiconductor process, as an oscillator capable of overcoming various problems of a quartz crystal unit.

FIG. 17 is a diagram illustrating a basic structure of a conventional MEMS oscillator.

A conventional MEMS oscillator 999 is a feedback-type oscillation circuit which includes a MEMS resonator 1001 as a resonance circuit, and a driver amplifier 1002 as an amplification circuit and, further, is adapted to feed back and amplify an output (an oscillation signal) from the driver amplifier 1002 through the MEMS resonator 1001, with a closed loop 1003.

The MEMS resonator 1001 includes an input electrode 1001a, a MEMS oscillating member (MEMS vibrator) 1001b and an output electrode 1001c, wherein the input electrode 1001a and the oscillating member 1001b are spaced apart from each other, and the oscillating member 1001b and the output electrode 1001c are spaced apart from each other, with a predetermined interval interposed therebetween. Further, a bias voltage (a DC voltage, $V_{DC}$) is applied to the MEMS oscillating member 1001b.

If an oscillation signal (an input signal) 1004 (AC voltage, $V_{AC}$) is inputted to the input electrode 1001a, an excitation force is exerted on the MEMS oscillating member 1001b. Further, if the frequency of the oscillation signal 1004 ($V_{AC}$) is coincident with the mechanical resonance frequency of the MEMS oscillating member 1001b, this causes the MEMS oscillating member 1001b to largely oscillate, which causes the output electrode 1001c to output a feed-back signal 1006 (a displacement electric current).

FIG. 18 is a graph illustrating changes of resonance characteristic due to changes of the signal level of the oscillation signal 1004 (the amplitude of $V_{AC}$) which is inputted to the MEMS resonator 1001. A characteristic 1011 represents a resonance characteristic of the MEMS resonator 1001, in a case where the signal level of the oscillation signal 1004 falls within a predetermined proper range. In cases where the signal level of the oscillation signal 1004 falls within the predetermined proper range as described above, the resonance characteristic of the MEMS resonator 1001 exhibits bilateral symmetry centered at the resonance frequency fc. In this case, within the predetermined proper range regarding the signal level of the oscillation signal 1004, in oscillating the MEMS oscillating member 1001b, the oscillation signal 1004 has such a signal level as to prevent prominent appearances of the effects of pulling the MEMS oscillating member 1001b by the input and output electrodes (1001a and 1001c) (capacitive bifurcation), due to excessive electrostatic forces exerted between the MEMS oscillating member 1001b and the input and output electrodes (1001a and 1001c) as the MEMS oscillating member 1001b gets too close to the input and output electrodes (1001a and 1001c). Further, the maximum value within the proper range is a value proportional to the product of the Q factor of the MEMS resonator 1001, the signal level of the inputted oscillation signal 1004 (the amplitude of the voltage $V_{AC}$), and the bias voltage ($V_{DC}$) applied to the MEMS oscillating member 1001b and, thus, can be preliminarily determined. In this case, the Q factor, which is a dimensionless number obtained by dividing the resonance frequency by a half width, is an index indicating the acuteness of the resonance, which can be used in evaluating the performance of the resonator.

As indicated by an arrow 1014, if the signal level of the oscillation signal 1004 inputted to the MEMS oscillator 1001 is increased beyond the proper range, distortions appear in the resonance characteristic of the MEMS resonator 1001 as in characteristics 1012 and 1013, which degrades its bilateral symmetry, thereby causing decreases of the peak gain and deterioration of the Q factor. Further, if an oscillation signal 1004 at a further increased level is inputted to the MEMS resonator 1001, this may collapse the MEMS resonator 1001. Namely, the MEMS resonator 1001 has the characteristics of degrading the peak gain and the Q factor and, also, degrading the stability of the resonance frequency, if the voltage of the signal inputted thereto is excessively larger. Therefore, it is desired to control the driver amplifier 1002 such that the signal level of the oscillation signal 1004 inputted to the MEMS resonator 1001 falls within the proper range.

FIG. 19 is a block diagram illustrating the structure of a MEMS oscillator described in Patent Literature 1 (JP 2004-201320 A).

A MEMS oscillator 1000 in Patent Literature 1 includes a MEMS resonator 1001, a driver amplifier 1002, and an auto gain control unit (Auto Gain Control, AGC) 1005. The MEMS oscillator 1000 forms a closed loop 1003, similarly to the MEMS oscillator 999. Further, the AGC 1005 is adapted to monitor the amplitude of an output from the driver amplifier 1002 (an oscillation signal 1004) and to control the gain of the driver amplifier 1002.

In the MEMS oscillator 1000, the AGC 1005 controls the gain of the driver amplifier 1002, such that the level (the amplitude) of the oscillation signal 1004 (the AC voltage) falls within the proper range. By doing this, it is possible to prevent the AC voltage 1004 at an excessively-higher level from being inputted to the MEMS resonator 1001. In this case, the proper range refers to a range of the level of the AC voltage 1004 which prevents occurrence of distortions in the resonance characteristic of the MEMS resonator 1001 as described above.

As described above, in Patent Literature 1, it is possible to prevent deterioration of the resonance characteristic of the MEMS resonator 1001 due to inputting of the AC voltage (the oscillation signal 1004) at an excessively-higher level to the MEMS resonator 1001, thereby preventing increases of phase noises contained in the oscillation signal 1004.

CITATION LIST

Patent Literature

PTL 1: JP 2004-201320 A

SUMMARY OF INVENTION

Technical Problem

In Patent Literature 1, the level (the amplitude) of the AC voltage 1004 inputted to the MEMS resonator 1001 is maintained constant, regardless of the operating temperature of the MEMS resonator 1001. Further, the bias voltage (the DC voltage) applied to the oscillating member (vibrator) of the MEMS resonator 1001 is constant, regardless of the operating temperature. That is, in Patent Literature 1, no consideration is given to the temperature dependency of the resonance characteristic of the MEMS resonator, at all.

However, in general, the resonance characteristic of the MEMS resonator has temperature dependency and, thus, the peak gain (the gain at the resonance frequency) and the Q factor are monotonously decreased (increased) with the increase (decrease) of the operating temperature.

Therefore, as the operating temperature of the MEMS resonator 1001 is increased, the Q factor and the peak gain of the MEMS resonator 1001 are decreased, and the level of a signal 1006 fed back to the driver amplifier 1002 is lowered. As a result thereof, in operations within a higher temperature region, S/N deteriorates at the input to the driver amplifier 1002, thereby increasing phase noises in the oscillation signal 1004. Namely, in operations in such a higher temperature region, the MEMS oscillator deteriorates in phase stability, in comparison with that in operations in a middle temperature region.

On the contrary, if the operating temperature of the MEMS resonator 1001 is decreased, this increases the Q factor of the MEMS resonator 1001. If the Q factor is increased, even when the level (the amplitude) of the inputted signal is the same, the oscillation amplitude of the oscillating member of the MEMS resonator 1001 is increased. As a result thereof, even when the level (the amplitude) of the inputted oscillation signal 1004 is such a level as to fall within the proper range (such a level (an amplitude) as to induce no distortion in the resonance characteristic of the MEMS resonator 1001) for operations in the middle temperature region and in the higher temperature region, the oscillation signal 1004 may form an excessively-larger input and, therefore, may cause distortions in the resonance characteristic of the MEMS resonator 1001 in operations in a lower temperature region. If distortions are induced in the resonance characteristic of the MEMS resonator 1001, this reduces both the peak gain and the Q factor of the MEMS resonator 1001 and, also, degrades the stability of the resonance frequency. Accordingly, even in operations in the lower temperature region, the MEMS oscillator deteriorates in phase stability, in comparison with that in operations in the middle temperature region.

As described above, conventional MEMS oscillators have the problem of deterioration of the phase stability of oscillation signals (increases of phase noises), when the operating temperature is changed.

In view of the above circumstances, it is an object to provide a MEMS oscillator capable of further suppressing deterioration of the phase stability (increases of phase noises) along with the change of the operating temperature, over conventional techniques, even when the operating temperature of the MEMS resonator is changed.

Solution to Problem

In one aspect of the present invention, a MEMS oscillator according to an embodiment includes: a feedback-type oscillation circuit including a MEMS resonator and an amplifier; a voltage control unit operable to control a bias voltage applied to an oscillating member of the MEMS resonator; and an auto gain control unit operable to receive an output from the amplifier and to output, to the amplifier, based on a level of the output from the amplifier, an amplitude control signal for increasing or decreasing a gain of the amplifier such that the level of the output from the amplifier comes to be a predetermined level, for controlling the gain of the amplifier; wherein the voltage control unit controls the bias voltage applied to the oscillating member of the MEMS resonator based on an operating temperature of the MEMS resonator such that a peak gain of the MEMS resonator comes to have a predetermined value regardless of a level of the operating temperature, and the voltage control unit derives the operating temperature of the MEMS resonator, by monitoring the amplitude control signal.

In another aspect of the present invention, a MEMS oscillator according to another embodiment includes: a feedback-type oscillation circuit including a MEMS resonator and an amplifier; a voltage control unit operable to control a bias voltage applied to an oscillating member of the MEMS resonator; and an auto gain control unit operable to receive an output from the amplifier and to output, to the amplifier, based on a level of the output from the amplifier, an amplitude control signal for increasing or decreasing a gain of the amplifier such that the level of the output from the amplifier comes to be a predetermined level, for controlling the gain of the amplifier; wherein the voltage control unit controls the bias voltage applied to the oscillating member of the MEMS resonator based on an operating temperature of the MEMS resonator such that a peak gain of the MEMS resonator comes to have a predetermined value regardless of a level of the operating temperature, and the MEMS oscillator further includes a temperature sensor operable to measure the operating temperature of the MEMS resonator and to output a result of the measurement, the result of the measurement of the operating temperature outputted from the temperature sensor is inputted to the voltage control unit, and the voltage control unit uses the result of the measurement as the operating temperature of the MEMS resonator.

Advantageous Effects of Invention

The MEMS oscillator according to the present embodiment is adapted to control the bias voltage applied to the oscillating member of the MEMS resonator such that its peak gain has a predetermined value regardless of the operating temperature of the MEMS resonator and, therefore, is capable of outputting an oscillating signal with good phase noise characteristics at any operating temperatures.

DESCRIPTION OF EMBODIMENTS

1. Summary

1-1. Temperature Dependency of Phase Stability (Phase Noises) of a MEMS Oscillator At first, regarding the temperature dependency of a resonance characteristic of a MEMS resonator, and change of phase stability of an oscillation signal in a MEMS oscillator along with changes of the resonance characteristic of the MEMS resonator will be described.

Figure 1:
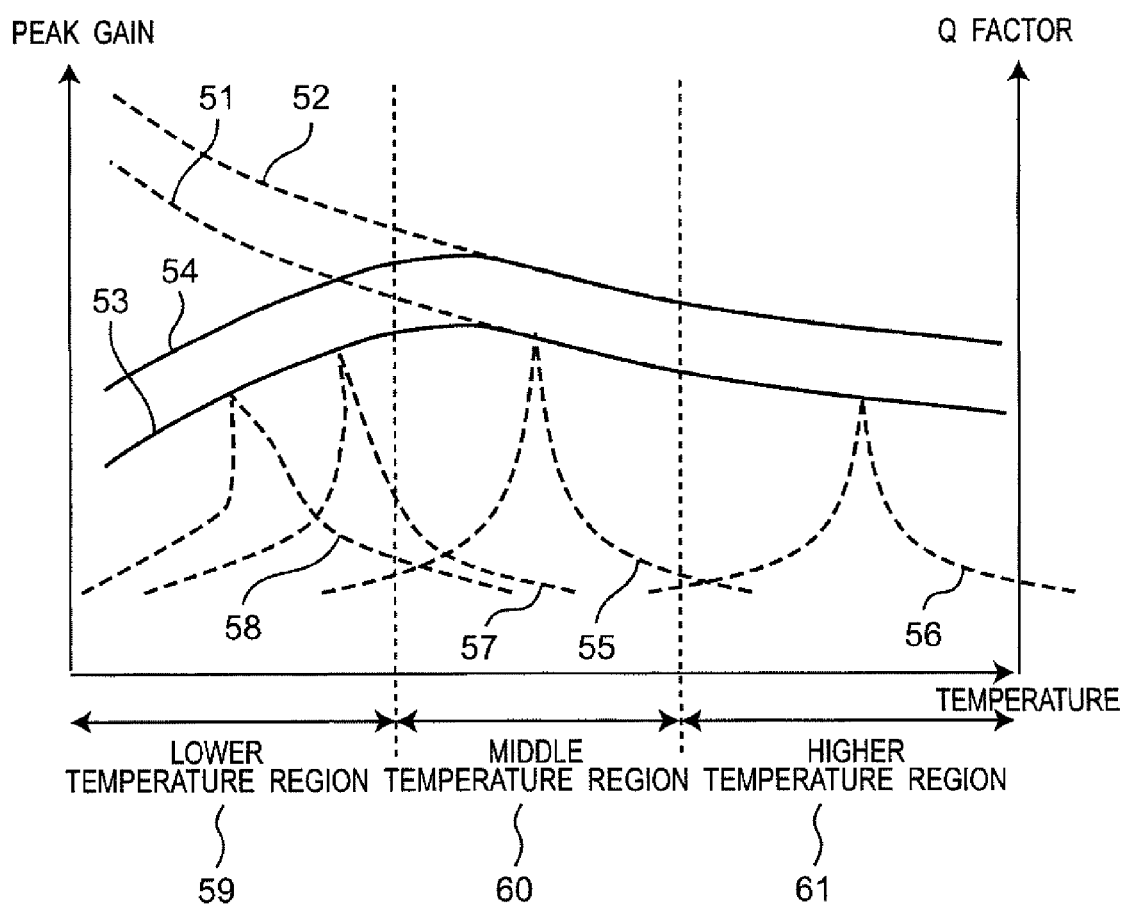
FIG. 1 is a graph illustrating temperature dependency of the peak gain and the Q factor of a MEMS resonator, in a case where the maximum amplitude of an oscillation signal (the level of an AC voltage inputted to the MEMS resonator) and a bias voltage (DC voltage) applied to a MEMS oscillating member (MEMS vibrator) are made constant.
Figure 17:
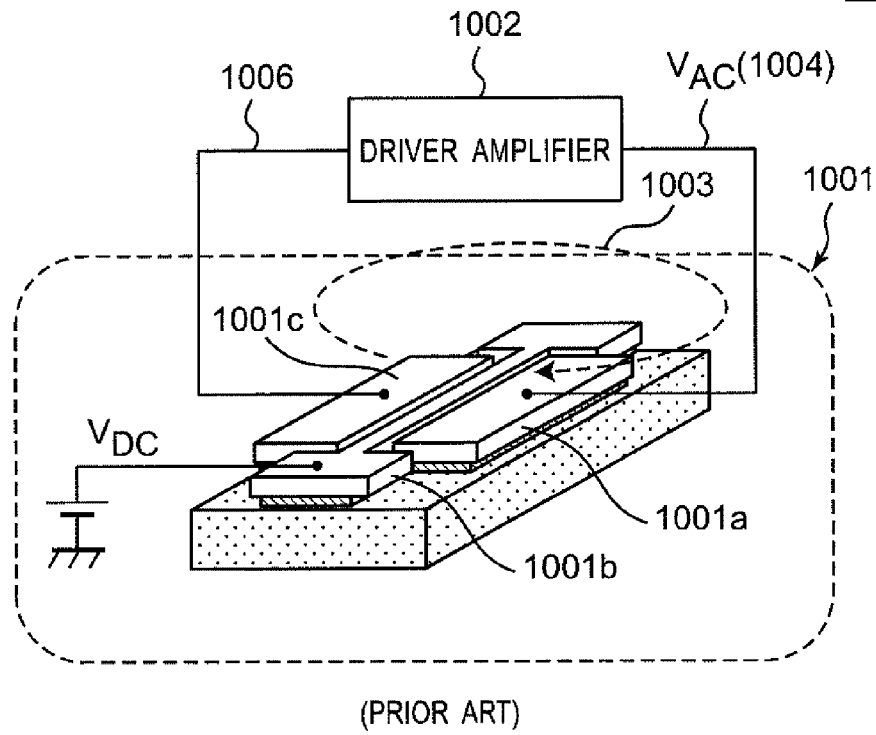
FIG. 17 is a diagram illustrating a basic structure of a conventional MEMS oscillator.
Figure 18:
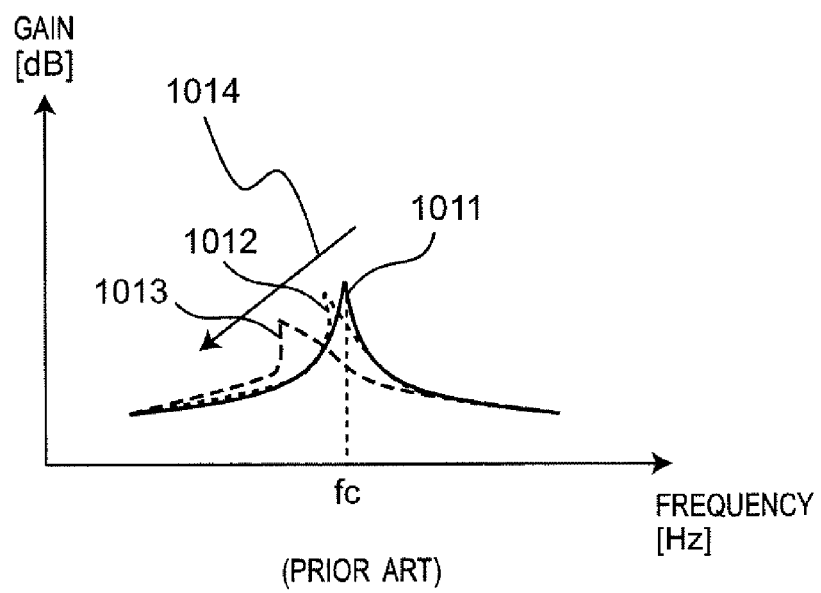
FIG. 18 is a graph illustrating changes of a resonance characteristic due to changes of the level of a signal which is inputted to the MEMS resonator.
Figure 19:
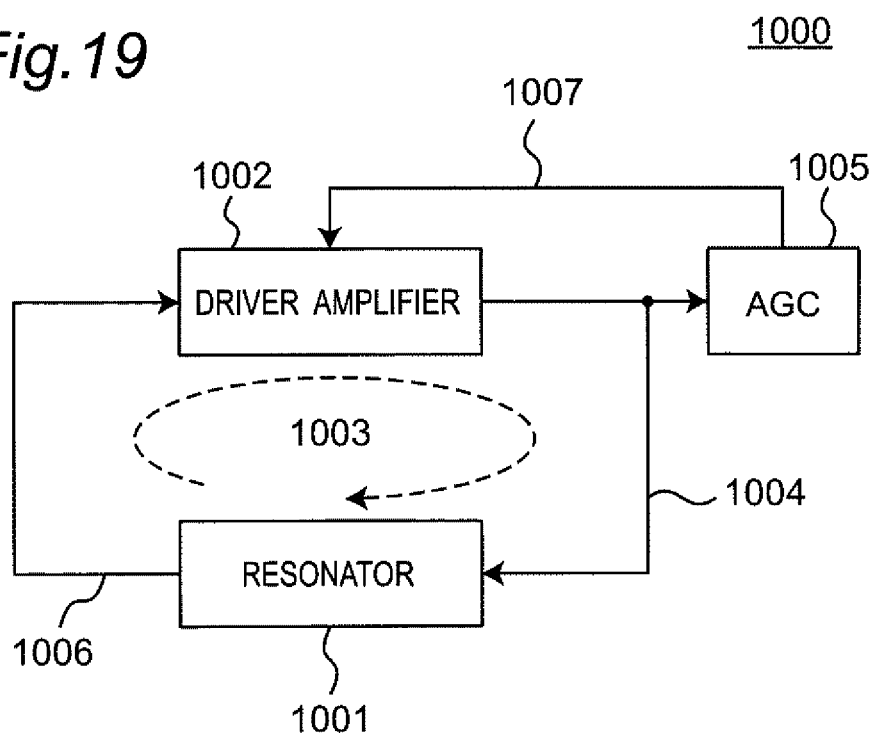
FIG. 19 is a block diagram of the structure of a MEMS oscillator described in Patent Literature 1.

FIG. 1 is a graph illustrating changes of a peak gain and a Q factor of a MEMS resonator. The present figure is the graph illustrating changes of the peak gain and the Q factor, in a case where only the operating temperature is changed while the amplitude (the level of an AC voltage inputted to the MEMS resonator) of an oscillation signal ($V_{AC}$ 1004 in FIG. 17 and the like) and a bias voltage (a DC voltage $V_{DC}$ in FIG. 17) applied to a MEMS oscillating member (MEMS vibrator) are maintained constant. Further, a plot 51 represents the peak gain of when no distortion is induced in the resonance characteristic of the MEMS resonator due to excessively-larger inputs, and a plot 52 represents the Q factor of when no distortion is induced in the resonance characteristic of the MEMS resonator, similarly. On the contrary, a plot 53 represents the peak gain of the MEMS resonator of when distortions are induced in the resonance characteristic of the MEMS resonator due to excessively-larger inputs, and a plot 54 represents the Q factor of the MEMS resonator of when distortions are induced in the resonance characteristic of the MEMS resonator, similarly.

In many cases, a level of the input to the MEMS resonator is set to be slightly lower than the upper limit value in a proper range for an expected operating temperature region (the middle temperature region 60 in FIG. 1), in order to improve the S/N characteristic in the expected operating temperature region. Therefore, as indicated by a resonance characteristic 55, in the middle temperature region 60, the resonance characteristic exhibits a relatively-higher peak gain and, also, exhibits preferable bilateral symmetry. However, if the operating temperature is decreased, this increases the Q factor of the MEMS resonator, which increases the oscillation amplitude of the oscillating member of the MEMS resonator, thereby lowering the upper limit value in the proper range permitted for the input level. As a result thereof, in a lower temperature region 59, the level of the input exceeds the proper range, which induces distortions in the resonance characteristic of the MEMS resonator as in resonance characteristics 57 and 58 and, also, degrades the peak gain 53 and the Q factor 54.

On the contrary, if the operating temperature is increased to above the expected operating temperature region (the middle temperature region 60), the Q factor 54 of the MEMS resonator is made to be lower than that in the middle temperature region 60 and, further, the peak gain 53 of the MEMS resonator is lowered, as in a resonance characteristic 56 in the higher temperature region 61. This lowers the level of the output from the MEMS resonator, which degrades S/N in the amplifier, thereby degrading phase noise characteristics of the oscillation signal in the MEMS resonator.

As described above, when the amplitude (the level of the AC voltage inputted to the MEMS resonator) of the oscillation signal ($V_{AC}$ 1004 in FIG. 17 and the like) and the bias voltage (the DC voltage $V_{Dc}$ in FIG. 17) applied to the MEMS oscillating member are maintained constant, in the lower temperature region 59 and in the higher temperature region 61, the MEMS resonator exhibits a resonance characteristic (a peak gain, stability of the resonance frequency, and the like) which are degraded in comparison with that in the middle temperature region 60.

Therefore, when the amplitude of the oscillation signal ($V_{AC}$ 1004 in FIG. 17 and the like) inputted to the MEMS resonator and the bias voltage (the DC voltage $V_{DC}$ in FIG. 17) applied to the MEMS oscillating member are maintained constant, in the lower temperature region 59 and in the higher temperature region 61, the oscillation signal in the MEMS resonator exhibits phase stability (a degree of phase noises contained therein) which is degraded in comparison with that in the middle temperature region 60.

Figure 2:
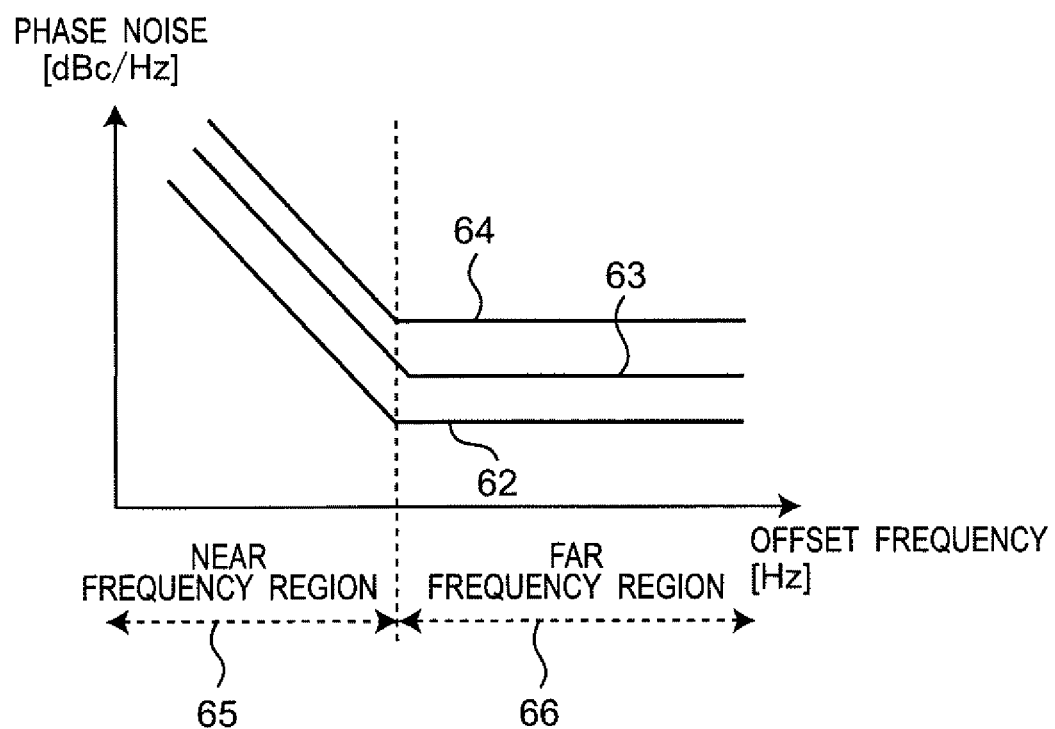
FIG. 2 is a graph illustrating phase noise characteristics of a conventional-type MEMS oscillator, in respective operating-temperature regions, which are a lower temperature region, a middle temperature region and a higher temperature region.

FIG. 2 is a graph illustrating phase noise characteristics of the MEMS oscillator, in the respective operating-temperature regions, which are the lower temperature region 59, the middle temperature region 60 and the higher temperature region 61 in FIG. 1. The horizontal axis represents a offset frequency with respect to the resonance frequency of the MEMS resonator, while the vertical axis represents a ratio of the phase noise energy to the carrier energy.

A phase noise characteristic 62 is a phase noise characteristic of the MEMS oscillator in the middle temperature region 60 in FIG. 1. Further, a phase noise characteristic 63 is a phase noise characteristic of the MEMS oscillator in the lower temperature region 59 in FIG. 1, and a phase noise characteristic 64 is a phase noise characteristic of the MEMS oscillator in the higher temperature region 61 in FIG. 1.

As can be seen from FIG. 2, when the amplitude of the oscillation signal ($V_{AC}$ 1004 in FIG. 17 and the like) inputted to the MEMS resonator, and the bias voltage (the DC voltage $V_{Dc}$ in FIG. 17) applied to the MEMS oscillating member are maintained constant, phase noises in the MEMS oscillator are increased, in both cases where the operating temperature comes to be a temperature higher than the expected operating temperature region and cases where the operating temperature comes to be a temperature lower than the expected operating temperature region, both in a near frequency region 65 within which phase noises are decreased as the frequency gets farther away from the resonance frequency and in a far frequency region 66 within which phase noises are constant regardless of the offset frequency.

Further, phase noises in the near frequency region 65 largely depend on 1/f noises in the amplifier (the driver amplifier 1002 in FIG. 17 and the like) and on the Q factor of the MEMS resonator, while phase noises in the far frequency region 66 are caused by thermal noises in the amplifier.

1-2. Embodiments

In view of the above problems, a MEMS oscillator according to an embodiment is adapted to variably control a bias voltage (a DC voltage $V_{Dc}$ in FIG. 17) applied to a MEMS oscillating member (MEMS vibrator), based on the operating temperature of a MEMS resonator. By doing this, with the MEMS oscillator according to the present embodiment, it is possible to maintain the peak gain of the MEMS resonator constant, at any operating temperatures. Accordingly, with the MEMS oscillator according to the present embodiment, it is possible to suppress reduction of the peak gain of the MEMS resonator, thereby suppressing deterioration of the Q factor and deterioration of S/N in the amplifier, in operations in a higher temperature region. Further, with the MEMS oscillator according to the present embodiment, it is possible to suppress distortions of a resonance characteristic of the MEMS resonator due to excessive inputs to the MEMS resonator, which suppresses reduction of the peak gain and the Q factor and instability of the resonance frequency due to the occurrence of distortions of the resonance characteristic, in operations in a lower temperature region. The MEMS oscillator according to the present embodiment is adapted to variably control the bias voltage in such a way as to maintain the peak gain of the MEMS resonator constant. Thus, in the lower temperature region and in the higher temperature region, it is possible to reduce the degree of phase noises contained in the oscillation signal to the same degree as that in a middle temperature region.

Further, with the MEMS resonator according to the present embodiment, it is also possible to variably control the amplitude of the oscillation signal ($V_{AC}$ 1004 in FIG. 17 and the like) inputted to the MEMS resonator, based on the operating temperature of the MEMS resonator. By doing this, with the MEMS oscillator according to the present embodiment, it is possible to maintain the signal level of the oscillation signal inputted to the MEMS resonator within a range which prevents distortions of the resonance characteristic of the MEMS resonator and, further, it is possible to maintain the level of a signal fed-back to the amplifier from the MEMS resonator at a constant level. Accordingly, in operations in the lower temperature region, the MEMS oscillator according to the present embodiment is capable of suppressing the occurrence of distortions in the resonance characteristic of the MEMS resonator due to excessive inputs to the MEMS resonator, which suppresses reduction of the peak gain and the Q factor and instability of the resonance frequency due to the occurrence of distortions in the resonance characteristic. Since the MEMS oscillator according to the present embodiment is capable of maintaining the signal level of the oscillation signal inputted to the MEMS resonator within a range which prevents distortions of the resonance characteristic of the MEMS resonator and, further, is capable of controlling the amplitude of the oscillation signal in such a way as to maintain the level of the signal fed-back to the amplifier from the MEMS resonator at a constant level, in the lower-temperature region, it is possible to reduce the degree of phase noises contained in the oscillation signal to the same degree as that of phase noises in the middle temperature region.

In other words, a MEMS oscillator according to an embodiment of the present invention is a MEMS oscillator including: a feedback-type oscillation circuit including a MEMS resonator and an amplifier; a voltage control unit operable to control a bias voltage applied to an oscillating member of the MEMS resonator; and an auto gain control unit operable to receive an output from the amplifier and to output, to the amplifier, based on a level of the output from the amplifier, an amplitude control signal for increasing or decreasing a gain of the amplifier such that the level of the output from the amplifier comes to be a predetermined level, for controlling the gain of the amplifier; wherein the voltage control unit controls the bias voltage applied to the oscillating member of the MEMS resonator based on an operating temperature of the MEMS resonator such that a peak gain of the MEMS resonator comes to have a predetermined value regardless of a level of the operating temperature, and the voltage control unit derives the operating temperature of the MEMS resonator, by monitoring the amplitude control signal.

Further, a MEMS oscillator according to another embodiment of the present invention is a MEMS oscillator including: a feedback-type oscillation circuit including a MEMS resonator and an amplifier; a voltage control unit operable to control a bias voltage applied to an oscillating member of the MEMS resonator; and an auto gain control unit operable to receive an output from the amplifier and to output, to the amplifier, based on a level of the output from the amplifier, an amplitude control signal for increasing or decreasing a gain of the amplifier such that the level of the output from the amplifier comes to be a predetermined level, for controlling the gain of the amplifier; wherein the voltage control unit controls the bias voltage applied to the oscillating member of the MEMS resonator based on an operating temperature of the MEMS resonator such that a peak gain of the MEMS resonator comes to have a predetermined value regardless of a level of the operating temperature, and the MEMS oscillator further includes a temperature sensor operable to measure the operating temperature of the MEMS resonator and to output a result of the measurement, the result of the measurement of the operating temperature outputted from the temperature sensor is inputted to the voltage control unit, and the voltage control unit uses the result of the measurement as the operating temperature of the MEMS resonator.

Further, in the MEMS oscillator according to each of the above embodiments, the MEMS oscillator may be adapted to perform control such that the peak gain of the MEMS resonator comes to have a predetermined value, regardless of the level of the operating temperature, by controlling the bias voltage applied to the oscillating member of the MEMS resonator through the voltage control unit or by controlling the auto gain control unit, based on the operating temperature of the MEMS resonator.

Further, in addition to the above additional features or instead thereof, in the MEMS oscillator according to each of the above embodiments, for example, the voltage control unit may be adapted to control the bias voltage applied to the oscillating member of the MEMS resonator such that the peak gain of the MEMS resonator comes to have a predetermined value regardless of the level of the operating temperature, when the operating temperature of the MEMS resonator is higher than a predetermined temperature, and the voltage control unit may be adapted to control the bias voltage such that the bias voltage comes to have a constant value regardless of the level of the operating temperature and controls the auto gain control unit such that a level of a feed-back signal comes to be a predetermined level regardless of the level of the operating temperature, when the operating temperature of the MEMS resonator is lower than the predetermined temperature.

Further, in addition to at least one of the above additional features or instead thereof, in the MEMS oscillator according to each of the above embodiments, for example, when the operating temperature of the MEMS resonator is higher than a predetermined temperature, the voltage control unit may be adapted to perform control, in such a way as to cause the level of the feed-back signal to have the same value as that of a signal level at the predetermined temperature and to increase the bias voltage to above the bias voltage at the predetermined temperature, and when the operating temperature of the MEMS resonator is lower than a predetermined temperature, the voltage control unit may be adapted to perform control, in such a way as to cause the bias voltage to have the same value as the bias voltage at the predetermined temperature and as to decrease the level of the feed-back signal to below the signal level at the predetermined temperature.

Further, in addition to at least one of the above additional features or instead thereof, the MEMS oscillator according to each of the above embodiments may further include: for example, a PLL frequency synthesizer unit operable to receive an output of the amplifier and to output an output signal; and a frequency-division-ratio control unit operable to control a frequency division ratio of a programmable frequency divider placed in a feedback section in the PLL frequency synthesizer unit, based on the operating temperature of the MEMS resonator and the bias voltage applied to the oscillating member of the MEMS resonator, wherein the frequency-division-ratio control unit may be adapted to control the frequency division ratio in the programmable frequency divider, such that the output signal has a predetermined frequency, regardless of the levels of the operating temperature and the bias voltage.

2. First Embodiment

Hereinafter, a MEMS oscillator according to a first embodiment will be described.

Figure 3:
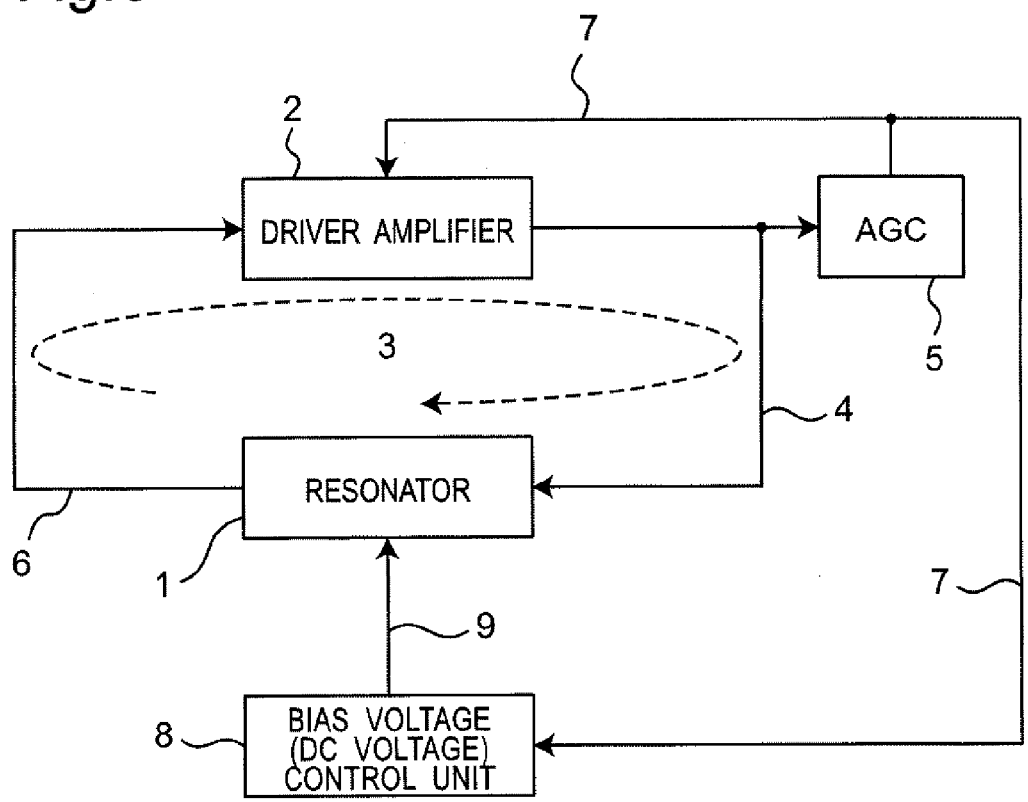
FIG. 3 is a block diagram of the structure of a MEMS oscillator according to a first embodiment.

FIG. 3 is a block diagram illustrating the structure of a MEMS oscillator 100 according to the first embodiment. The MEMS oscillator 100 includes a MEMS resonator 1 as a resonant circuit, a driver amplifier 2 as an amplification circuit, an auto gain control unit (AGC) 5 which is adapted to monitor the amplitude of an output (an oscillation signal 4) from the driver amplifier 2 and to control the gain of the driver amplifier 2, and a bias-voltage control unit 8 which is adapted to derive the operating temperature of the MEMS resonator 1 based on an amplitude control signal outputted from the AGC 5 and to control a bias voltage (a DC voltage $V_{Dc}$ in FIG. 17) applied to an oscillating member (vibrator) in the MEMS resonator 1 based on the operating temperature. The MEMS resonator 1 and the driver amplifier 2 form a closed loop 3, which forms a feedback type oscillation circuit.

Figure 4:
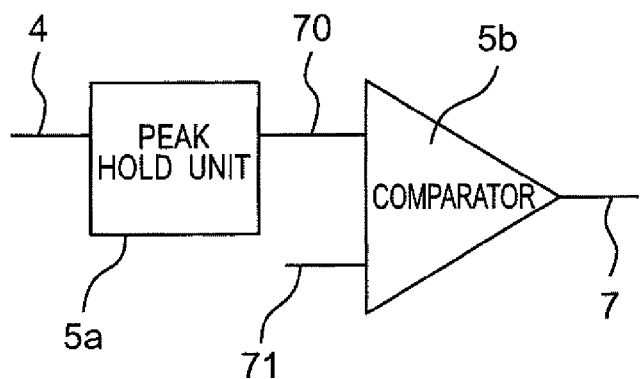
FIG. 4 is a diagram of the structure of an auto gain control unit (AGC).

The AGC 5 controls the gain of the driver amplifier 2 such that the signal level of the oscillation signal 4 (the maximum amplitude of the AC voltage) comes to have a preliminarily-set predetermined value. FIG. 4 is a diagram illustrating an example of the circuit structure of the AGC 5. In the present example, the AGC 5 includes a peak hold unit 5a which is adapted such that the oscillation signal 4 outputted from the driver amplifier 2 is inputted thereto and, further, is adapted to hold the peak of the oscillation signal 4. Further, the AGC 5 includes a comparator 5b adapted to make a comparison between an envelope signal 70 (a signal indicative of the peak value of the oscillation signal 4) outputted from the peak hold unit 5a and a set voltage signal 71 (a signal indicative of the aforementioned predetermined value). The comparator 5b outputs Low as an amplitude control signal 7 when the envelope signal 70 is lower than the set voltage signal 71. On the contrary, when the envelope signal 70 is higher than the set voltage signal 71, it outputs High.

The amplitude control signal 7 outputted from the AGC 5 is inputted to a gate of a MOS (Metal Oxide Semiconductor) which is placed in parallel with an output terminal of the driver amplifier 2, for example. If the inputted amplitude control signal 7 is Low, this makes a parallel resistance smaller, which increases the gain of the driver amplifier 2. If the inputted amplitude control signal 7 is High, this makes the parallel resistance larger, which decreases the gain of the driver amplifier 2. Due to the effect of the AGC 5, the signal level of the oscillation signal 4 (the maximum amplitude of the AC voltage) outputted from the driver amplifier 2 is maintained at the preliminarily-set predetermined value.

The peak gain of the MEMS resonator 1 is changed with the operating temperature as illustrated in FIG. 1. Even under such conditions, the AGC 5 controls the amplitude of the oscillation signal 4 to be constant. That is, if the peak gain of the MEMS resonator 1 is changed with the change of the operating temperature, the gain of the driver amplifier 2 is changed along therewith, in such a way as to compensate for it. Further, the example of the structure of the AGC 5 is merely an example.

The bias-voltage control unit 8 monitors the amplitude control signal 7 outputted from the AGC 5. If the monitored amplitude control signal 7 is Low, the bias-voltage control unit 8 determines that the operating temperature of the MEMS resonator 1 has been increased to reduce the peak gain of the MEMS resonator 1 and, thus, the bias-voltage control unit 8 outputs, to the MEMS resonator 1, a bias-voltage control signal 9 for increasing the bias voltage. If the monitored amplitude control signal 7 is High, the bias-voltage control unit 8 determines that the operating temperature of the MEMS resonator 1 has been decreased to excessively increase the peak gain of the MEMS resonator 1 and, thus, the bias-voltage control unit 8 outputs, to the MEMS resonator 1, a bias-voltage control signal 9 for decreasing the bias voltage. By doing this, the bias-voltage control unit 8 variably controls the bias voltage applied to the oscillating member of the MEMS resonator 1 based on the amplitude control signal 7 outputted from the AGC 5, thereby maintaining the peak gain of the MEMS resonator 1 constant.

Figure 5:
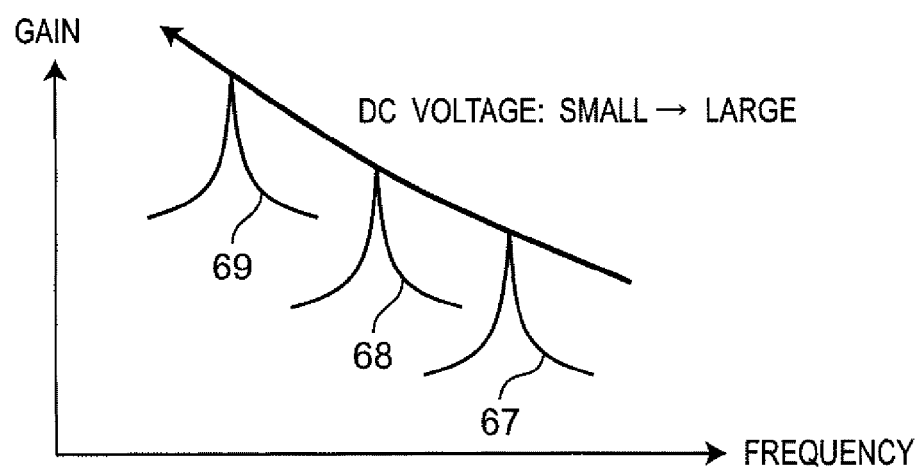
FIG. 5 is a chart illustrating changes of the peak gain and the resonance frequency of the MEMS resonator when the bias voltage (the DC voltage) is changed.

As illustrated in FIG. 1, the peak gain and the Q factor of the MEMS resonator 1 are changed with the operating temperature. The bias-voltage control unit 8 detects the changes of the peak gain and the Q factor of the MEMS resonator 1, namely the change of the operating temperature, by monitoring the amplitude control signal 7 outputted from the AGC 5. Further, the peak gain of the MEMS resonator 1 is proportional to the product of the Q factor of the MEMS resonator 1 and the bias voltage applied to the oscillating member. FIG. 5 is a chart illustrating changes of a resonance characteristic of the MEMS resonator when the bias voltage (the DC voltage) is increased. As illustrated in the present figure, if the bias voltage (the DC voltage) is increased, the resonance characteristic changes from a characteristic 67 toward a characteristic 69. To cope therewith, the bias-voltage control unit 8 changes the bias voltage in such a way as to cancel the change of the peak gain due to the change of the Q factor of the MEMS resonator 1, thereby maintaining the peak gain of the MEMS resonator 1 constant.

Figure 6:
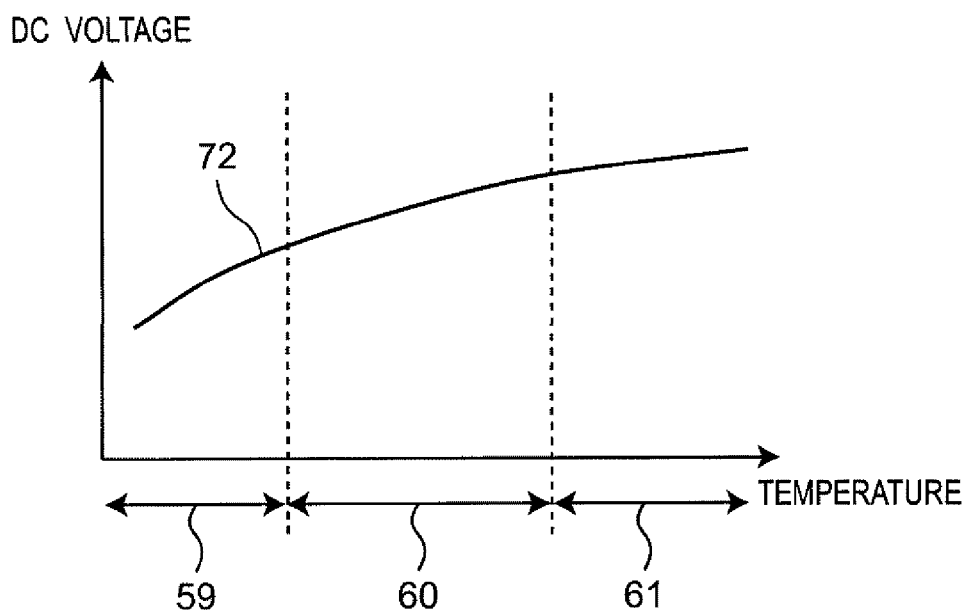
FIG. 6 is a chart illustrating a characteristic of control of the bias voltage (the DC voltage) in the MEMS oscillator according to the first embodiment (a graph illustrating the relationship between the bias voltage and the operating temperature).
Figure 7:
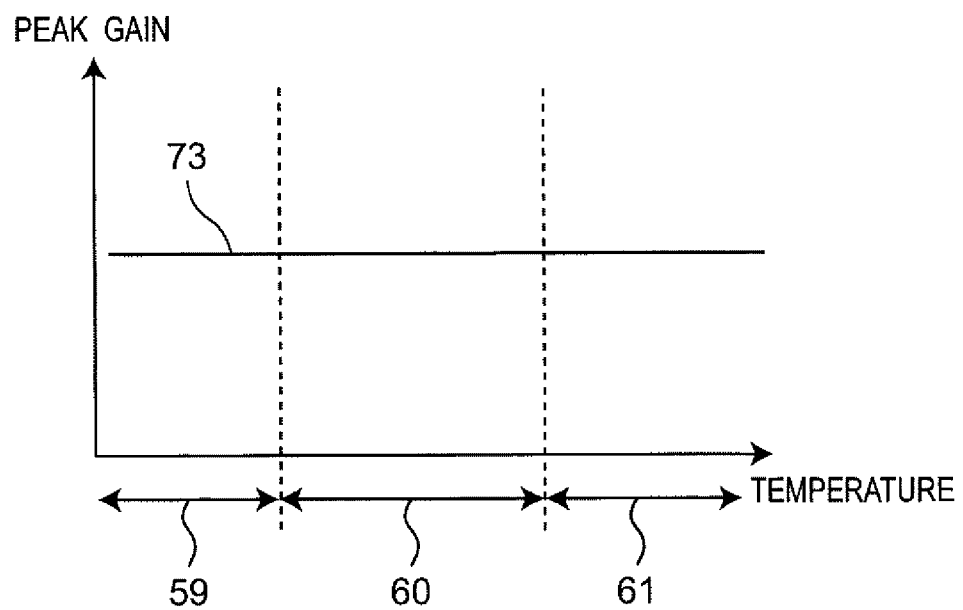
FIG. 7 is a graph illustrating the relationship between the peak gain and the operating temperature, in the MEMS oscillator according to the first embodiment.

FIG. 6 is a plot of the bias voltage (the DC voltage) applied to the oscillating member of the MEMS resonator 1, which is variably controlled according to the operating temperature, by the bias-voltage control unit 8. FIG. 7 is a plot illustrating a change of the peak gain of the MEMS resonator 1 with the temperature, wherein the bias voltage therein is controlled as described above.

In operations in a lower-temperature region 59, the bias-voltage control unit 8 cancels the increase of the Q factor of the MEMS resonator 1 due to the decrease of the operating temperature, by lowering the bias voltage, in order to maintain the peak gain constant (FIG. 7). This suppresses the reduction of the upper limit value in a proper range permitted for the input level. Accordingly, in operations in the lower-temperature region 59, it is possible to suppress distortions in the resonance characteristic of the MEMS resonator 1 due to excessive inputs to the MEMS resonator 1, which suppresses decreases of the peak gain and the Q factor and instability of the resonance frequency, due to the occurrence of distortions in the resonance characteristic. Accordingly, even within the lower-temperature region 59, it is possible to reduce the degree of phase noises contained in the oscillation signal 4 to the same degree as that of phase noises in a middle-temperature region 60.

In operations in a higher-temperature region 61, the bias-voltage control unit 8 cancels the decrease of the Q factor of the MEMS resonator 1 due to the increase of the operating temperature, by increasing the bias voltage, in order to maintain the peak gain constant (FIG. 7). This suppresses reduction of the level of a feed-back signal 6 which is outputted from the MEMS resonator 1 and inputted to the driver amplifier 2, thereby suppressing deterioration of S/N in the driver amplifier 2. Accordingly, even within the higher-temperature region 61, it is possible to reduce the degree of phase noises contained in the oscillation signal 4 to the same degree as that of phase noises in the middle temperature region 60.

Figure 8:
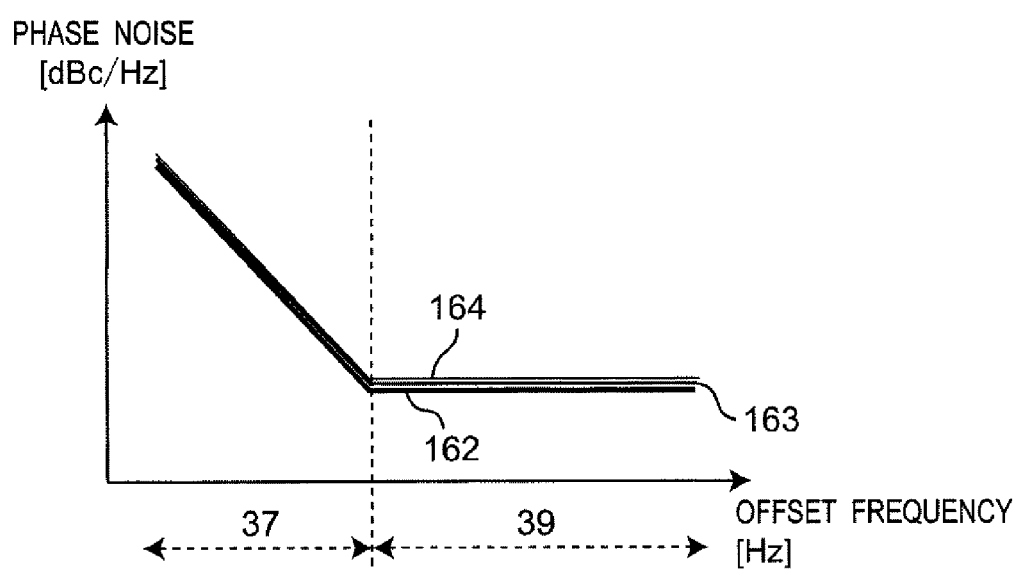
FIG. 8 is a graph illustrating phase noise characteristics of the MEMS oscillator according to the first embodiment, in respective operating-temperature regions, which are a lower temperature region, a middle temperature region and a higher temperature region.

FIG. 8 is a graph illustrating phase noise characteristics of the MEMS oscillator 100, in the respective operating-temperature regions, which are the lower-temperature region 59, the middle temperature region 60 and the higher-temperature region 61. A phase noise characteristic 162 is a phase noise characteristic of the MEMS oscillator 100 in the lower-temperature region 59. Further, a phase noise characteristic 163 is a phase noise characteristic of the MEMS oscillator 100 in the middle-temperature region 60, and a phase noise characteristic 164 is a phase noise characteristic of the MEMS oscillator 100 in the higher-temperature region 61.

In a near frequency region 37, the characteristic 162 at lower temperatures exhibits a slightly more preferable phase noise characteristic than that of the characteristic 163 at middle temperatures. In the near frequency region 37, the characteristic 164 at higher temperatures exhibits a slightly-deteriorated phase noise characteristic, due to the reduction of the Q factor of the MEMS resonator due to the increase of the operating temperature.

Further, in a far frequency region 39, similarly, the characteristic 162 at lower temperatures exhibits a slightly more preferable phase noise characteristic than that of the characteristic 163 at middle temperatures. In the far frequency region 39, the characteristic 164 at higher temperatures exhibits a slightly-deteriorated phase noise characteristic, since noise components N forming S/N at an input terminal of a driver amplifier 102 are increased in proportion to an absolute temperature T and a Boltzmann constant k. However, even in this case, the phase noise characteristic is degraded only by a small amount.

Further, the bias-voltage control unit 8 is enabled to hold information about the above predetermined value regarding the gain of the driver amplifier 2 and the amplitude control by the AGC 5, initial values (for example, values at the activation) of the bias voltage applied to the oscillating member of the MEMS resonator 1 and the like, and the relationships between the operating temperature and the Q factor, the peak gain, the resonance frequency and the like of the MEMS resonator 1. The bias-voltage control unit 8 is enabled to make references to these pieces of information and, further, is enabled to derive the operating temperature of the MEMS resonator 1 based on the monitored amplitude control signal 7.

As described above, in the lower temperature region and in the higher temperature region, the MEMS oscillator 100 according to the present embodiment is capable of reducing the degree of phase noises contained in the oscillation signal 4 to the same degree as that of phase noises in the middle temperature region (for example, around the operating temperature estimated at the time of designing). In the present embodiment, the lower temperature region 59 refers to the range equal to or higher than −40 degrees C. but lower than 20 degrees C., for example, the middle temperature region 60 refers to the range equal to or higher than 20 degrees C. but lower than degrees C., for example, and the higher temperature region 61 refers to the range equal to or higher than 30 degrees C. but lower than 125 degrees C., for example. The ranges of these temperature regions are merely illustrative, and the respective temperature regions are not limited to the temperature ranges of the respective temperature regions which have been illustrated above and can be properly set.

3. Second Embodiment

Hereinafter, a MEMS oscillator according to a second embodiment will be described.

Figure 9:
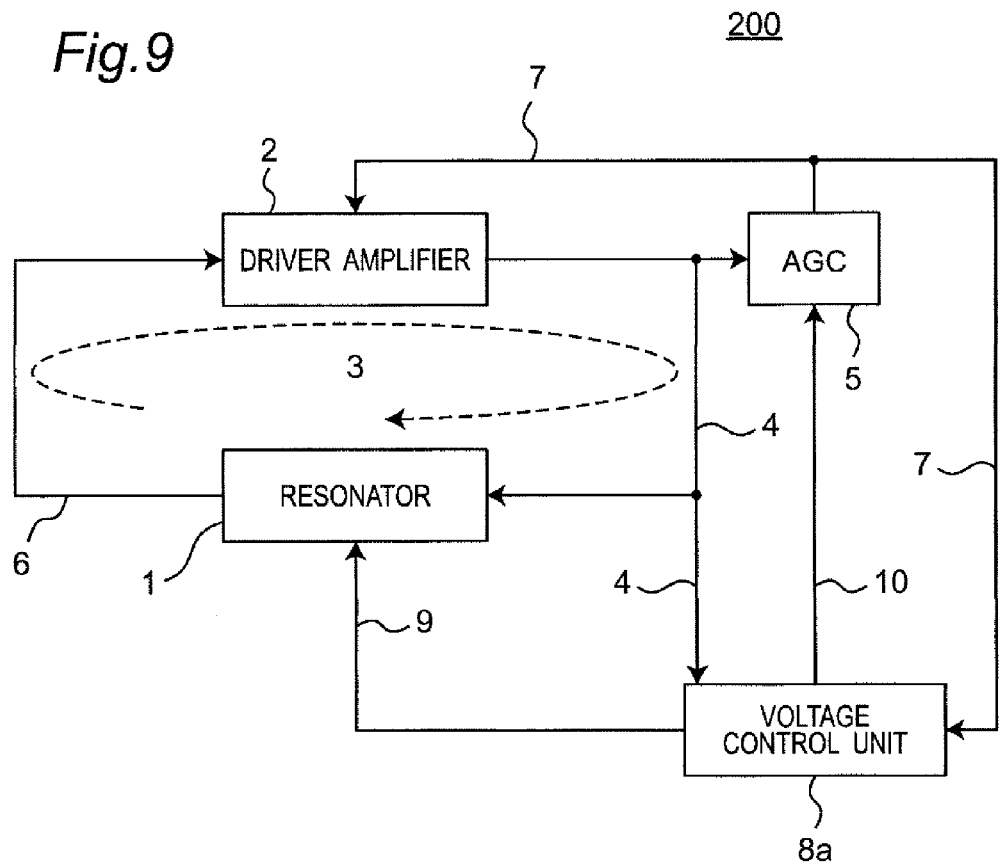
FIG. 9 is a block diagram of the structure of a MEMS oscillator according to a second embodiment.

FIG. 9 is a block diagram illustrating the structure of a MEMS oscillator 200 according to the second embodiment. The MEMS oscillator 200 includes a MEMS resonator 1, a driver amplifier 2, and an auto gain control unit (AGC) 5, similarly to the MEMS oscillator 100 according to the first embodiment. The MEMS oscillator 200 includes a bias-voltage control unit 8a which is adapted to derive the operating temperature of the MEMS resonator 1 based on an amplitude control signal outputted from the AGC 5 and, further, is adapted to control the AGC 5 and a bias voltage (a DC voltage $V_{DC}$ in FIG. 17) applied to an oscillating member of the MEMS resonator 1 based on this operating temperature, instead of the bias-voltage control unit 8 in the MEMS oscillator 100.

Similarly to the bias-voltage control unit 8 according to the first embodiment, the bias-voltage control unit 8a variably controls the bias voltage applied to the oscillating member of the MEMS resonator 1, based on the amplitude control signal 7 outputted from the AGC 5. Further, an oscillation signal 4 is inputted to the bias-voltage control unit 8a, and the bias-voltage control unit 8a is adapted to variably control the above predetermined value (the targeted voltage level of the oscillation signal 4) set in the AGC 5, based on the amplitude control signal 7 and the amplitude of the oscillation signal 4. More specifically, the bias-voltage control unit 8a variably controls the value indicated by a set voltage signal 71 (FIG. 4), based on the amplitude of the oscillation signal 4 and the amplitude control signal 7, thereby variably controlling the voltage level (the maximum amplitude) of the oscillation signal 4.

Figure 10:
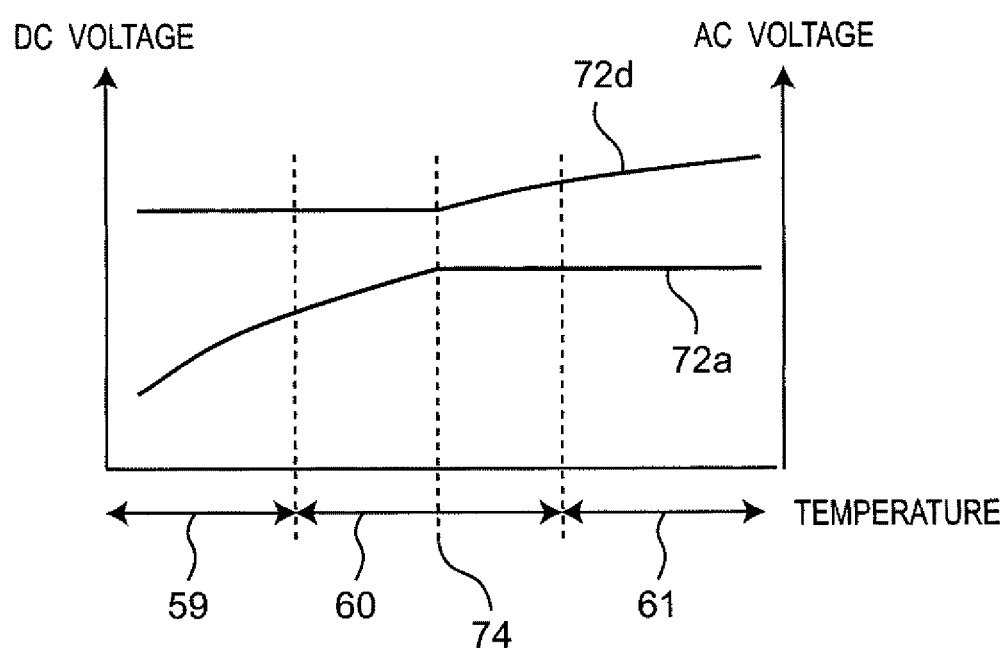
FIG. 10 is a chart illustrating characteristics of control of the bias voltage (the DC voltage) and the maximum amplitude of the oscillation signal (the level of the AC voltage) in the MEMS oscillator according to the second embodiment (a graph illustrating the relationships between the bias voltage and the operating temperature and between the oscillation-signal maximum amplitude and the operating temperature).

FIG. 10 is plots of a bias voltage (the DC voltage) 72d applied to the oscillating member of the MEMS resonator 1 and a voltage level 72a of the oscillation signal 4, which are variably controlled according to the operating temperature by the voltage control unit 8a.

The voltage control unit 8a variably controls the amplitude of the oscillation signal 4 inputted to the MEMS resonator 1 by controlling the AGC 5 (such that the amplitude of the oscillation signal 4 is made smaller as the temperature is lowered), in operations at temperatures in a lower temperature region 59 and up to a changeover temperature 74 included in a middle temperature region 60. In this case, the bias voltage is controlled to have the same value as that of the bias voltage at a predetermined temperature. By doing this, it is possible to maintain the signal level of the oscillation signal 4 inputted to the MEMS resonator 1 within a range which prevents distortions of the resonance characteristic of the MEMS resonator 1 and, further, it is possible to maintain the level of a signal 6 which is fed back to the driver amplifier 2 from the MEMS resonator 1 at a constant level. Accordingly, in operations at temperatures in the lower temperature region 59 and up to the changeover temperature 74, it is possible to suppress the occurrence of distortions in the resonance characteristic of the MEMS resonator 1 due to excessive inputs to the MEMS resonator 1, which suppresses reduction of the peak gain and the Q factor and instability of the resonance frequency due to the occurrence of distortions in the resonance characteristic. Accordingly, even within the lower-temperature region 59, it is possible to reduce the degree of phase noises contained in the oscillation signal 4 to the same degree as that of phase noises in the middle temperature region 60.

As described above, the oscillation amplitude of the oscillating member of the MEMS resonator 1 is proportional to the product of the Q factor of the MEMS resonator 1, the amplitude of the inputted oscillation signal 4, and the bias voltage applied to the oscillating member. Accordingly, in the present embodiment, in operations at lower temperatures, the amplitude of the inputted oscillation signal 4 is reduced to cope with the increase of the Q factor of the MEMS resonator 1, in order to maintain the oscillation amplitude of the oscillating member constant. This prevents appearances of distortions in the resonance characteristic of the MEMS resonator 1.

In operations at temperatures equal to or higher than the changeover temperature 74 and in the higher temperature region 61, similarly to in the first embodiment, the decrease of the Q factor of the MEMS resonator 1 due to the increase of the operating temperature is cancelled by increasing the bias voltage, thereby maintaining the peak gain constant (FIG. 7). This suppresses the reduction of the level of the feed-back signal 6 which is outputted from the MEMS resonator 1 and inputted to the driver amplifier 2, thereby suppressing the deterioration of S/N in the driver amplifier 2. Accordingly, within a temperature region equal to or higher than the changeover temperature 74, similarly, it is possible to reduce the degree of phase noises contained in the oscillation signal 4 to the same degree as that of phase noises in the middle temperature region 60. Further, as can be seen from FIG. 10, in a temperature region equal to or higher than a predetermined temperature (for example, a temperature region equal to or higher than the changeover temperature 74), the voltage control unit 8a controls the AGC 5 in such a way as to maintain the amplitude of the oscillation signal 4 constant.

As described above, the MEMS oscillator 200 according to the present embodiment is adapted to increase the bias voltage if the operating temperature comes to be a higher temperature equal to or higher than the changeover temperature 74. Further, the MEMS oscillator 200 according to the present embodiment is adapted to decrease the amplitude of the oscillation signal 4 if the operating temperature comes to be a lower temperature equal to or lower than the changeover temperature 74. By doing this, the signal component S (the feed-back signal 6) forming S/N in the driver amplifier 2 is maintained at the same degree regardless of the operating temperature and, further, the oscillation amplitude of the oscillating member of the MEMS resonator 1 is also maintained at the same degree regardless of the operating temperature.

With the MEMS oscillator 200 according to the present embodiment, it is possible to make the range of changes of the bias voltage (the difference between the bias voltages in the lower temperature region and the bias voltages in the higher temperature region) smaller than that with the MEMS resonator 100.

In this regard, the MEMS oscillator 200 is particularly advantageous in cases where there is a larger temperature range from the lower temperature region 59 to the higher temperature region 61. As the temperature range from the lower temperature region 59 to the higher temperature region 61 is made larger, the Q factor of the MEMS resonator 1 is changed by larger amounts. Therefore, if an attempt is made to cancel the change of the Q factor only by changing the bias voltage, it is necessary to change the bias voltage over a larger range. To cope therewith, the MEMS oscillator 200 is adapted to change the amplitude of the oscillation signal 4, instead of changing the bias voltage in operations at temperatures in the lower temperature region 59 and up to the changeover temperature 74. By doing this, the MEMS oscillator 200 can make the range of changes of the bias voltage smaller. Further, the changeover temperature 74 can be set such that the bias voltage is maintained at a voltage equal to or higher than a lowest voltage permitted as the bias voltage, at any operating temperatures.

Further, the bias-voltage control unit 8 is enabled to hold information about the aforementioned predetermined value regarding the gain of the driver amplifier 2 and the amplitude control by the AGC 5, initial values (for example, values at the activation) of the bias voltage applied to the oscillating member of the MEMS resonator 1 and the like, and the relationships between the operating temperature and the Q factor, the peak gain, the resonance frequency and the like of the MEMS resonator 1. The bias-voltage control unit 8 is enabled to make references to these pieces of information and, further, is enabled to derive the operating temperature of the MEMS resonator 1, based on the monitored amplitude control signal 7 and the amplitude of the inputted oscillation signal 4.

As described above, in the lower temperature region and in the higher temperature region, the MEMS oscillator 200 according to the present embodiment is capable of reducing the degree of phase noises contained in the oscillation signal 4 to the same degree as that of phase noises in the middle temperature region (for example, around the operating temperature estimated at the time of designing).

4. Third Embodiment

Hereinafter, a MEMS oscillator according to a third embodiment will be described.

Figure 11:
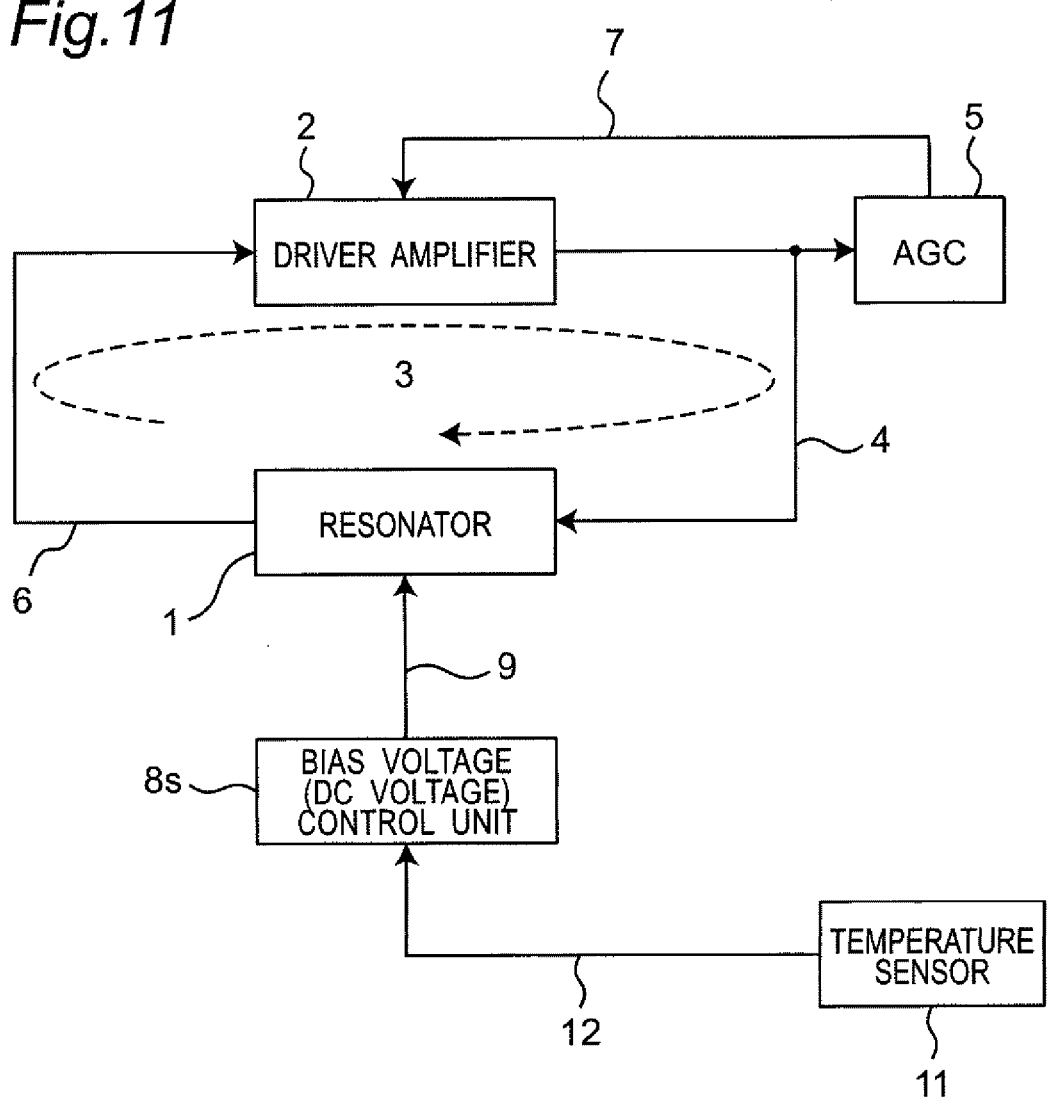
FIG. 11 is a block diagram of the structure of a MEMS oscillator according to a third embodiment.

The MEMS oscillator 300 according to the present embodiment illustrated in FIG. 11 is adapted to variably control the bias voltage applied to an oscillating member of a MEMS resonator 1, based on the operating temperature, similarly to the MEMS oscillator 100. By doing this, the MEMS oscillator according to the present embodiment can maintain the peak gain of the MEMS resonator constant, at any operating temperatures.

The MEMS oscillator 300 according to the present embodiment includes a temperature sensor 11 for measuring the operating temperature of the MEMS resonator 1, in addition to the same structure as that of the MEMS oscillator 100. The temperature sensor 11 outputs the measured operating temperature of the MEMS resonator 1, as a temperature information signal 12, to a bias-voltage control unit 8s.

The bias-voltage control unit 8s is adapted such that the temperature information signal 12 from the temperature sensor 11 is inputted thereto, instead of monitoring an amplitude control signal 7 outputted from an AGC 5. The bias-voltage control unit 8s variably controls the bias voltage applied to the oscillating member of the MEMS resonator 1, similarly to the MEMS oscillator 100, based on the temperature information signal 12.

The bias-voltage control unit 8s holds information about the relationships between the operating temperature and the Q factor, the peak gain and the like of the MEMS resonator 1 and, further, controls the bias voltage (see FIG. 6) such that the peak gain of the MEMS resonator 100 is constant at any operating temperature (see FIG. 7), based on this information and the temperature information signal 12.

As described above, in a lower temperature region and in a higher temperature region, the MEMS oscillator 300 according to the present embodiment is capable of reducing the degree of phase noises contained in the oscillation signal 4 to the same degree as that of phase noises in a middle temperature region (for example, around the operating temperature estimated at the time of designing).

5. Fourth Embodiment

Hereinafter, a MEMS oscillator according to a fourth embodiment will be described.

Figure 12:
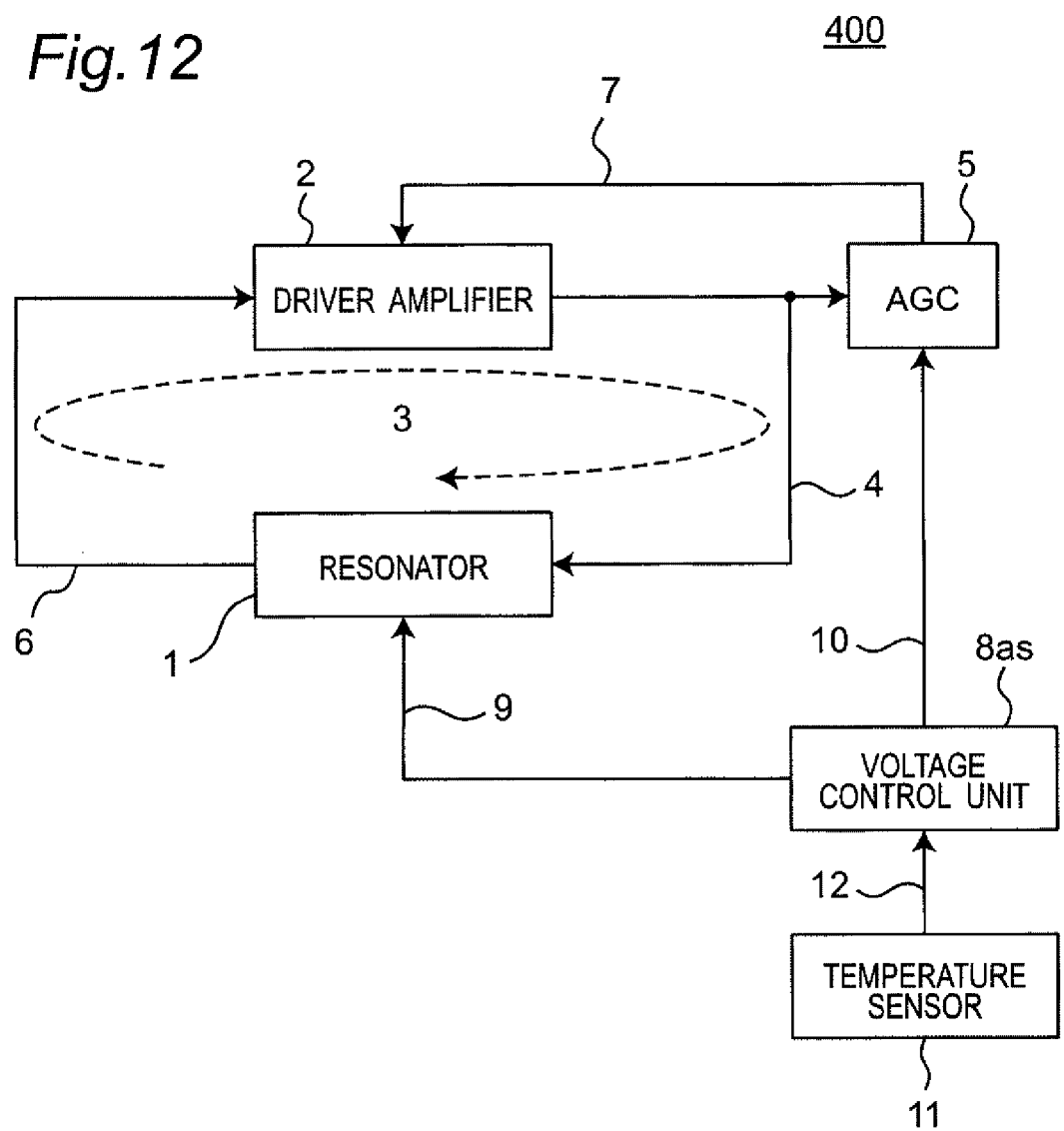
FIG. 12 is a block diagram of the structure of a MEMS oscillator according to a fourth embodiment.

The MEMS oscillator 400 according to the present embodiment illustrated in FIG. 12 is adapted to control an AGC 5 and a bias voltage applied to an oscillating member of a MEMS resonator 1, based on the operating temperature, similarly to the MEMS oscillator 200.

The MEMS oscillator 400 according to the present embodiment includes a temperature sensor 11 for measuring the operating temperature of the MEMS resonator 1, in addition to the same structure as that of the MEMS oscillator 200. The temperature sensor 11 outputs the measured operating temperature of the MEMS resonator 1, as a temperature information signal 12, to a voltage control unit 8as.

The temperature information signal 12 from the temperature sensor 11 is inputted to the voltage control unit 8as, instead of inputting, thereto, an oscillation signal 4 and an amplitude control signal 7 outputted from the AGC 5. The voltage control unit 8as variably controls the bias voltage applied to the oscillating member of the MEMS resonator 1 and the voltage level of the oscillation signal 4, similarly to the MEMS oscillator 200, based on the temperature information signal 12.

The voltage control unit 8as is adapted to control the bias voltage (the DC voltage) 72d applied to the oscillating member of the MEMS resonator 1 and the voltage level 72a of the oscillation signal 4, according to the operating temperature, as illustrated in FIG. 10, similarly to the voltage control unit 8a according to the second embodiment.

As described above, in a lower temperature region and in a higher temperature region, the MEMS oscillator 400 according to the present embodiment is capable of reducing the degree of phase noises contained in the oscillation signal 4 to the same degree as that of phase noises in a middle temperature region (for example, around the operating temperature estimated at the time of designing).

6. Fifth Embodiment

Hereinafter, a MEMS oscillator according to a fifth embodiment will be described.

It is known that the resonance frequency fc of a MEMS resonator 1 has temperature dependency. The MEMS resonator 1 is generally made of silicon and the like, and its resonance frequency fc has a temperature characteristic of about −20 [ppm/degree C], due to a temperature characteristic of the silicon. For example, if the operating temperature is changed by 100 degree C. from −20 to +80 degree C., this changes the resonance frequency fc by about 2000 [ppm]. Therefore, if the operating temperature of the MEMS resonator 1 is changed, this also changes the frequency of an oscillation signal 4.

Further, as illustrated in FIG. 5, if the bias voltage (the DC voltage) applied to the oscillating member of the MEMS resonator 1 is changed; the resonance frequency fc of the MEMS resonator 1 is also changed. It is known that, in this case, the resonance frequency change rate Delta-f/fc (fc: the resonance frequency, Delta-f: the amount of change of the resonance frequency) is proportional to the square of the bias voltage applied to the oscillating member.

To cope therewith, the MEMS oscillator according to the present embodiment is adapted to compensate for the variation of the frequency of the oscillation signal 4 due to the change of the operating temperature, and for the variation of the frequency of the oscillation signal 4 due to the change of the bias voltage. By doing this, the MEMS oscillator according to the present embodiment can output stable signals having less frequency variations, at any operating temperatures.

As illustrated in FIG. 1, the MEMS resonator 1 monotonously decreases (increases) its peak gain with the increase (decrease) of the operating temperature. However, the amplitude of the oscillation signal 4, as the output voltage, is controlled to be constant by the AGC 5 and, therefore, if the peak gain of the MEMS resonator 1 is changed due to a temperature change, the gain of the driver amplifier 2 is also changed along therewith. That is, the amplitude control signal 7 contains information about the operating temperature of the MEMS resonator 1. Accordingly, by controlling the frequency-division ratio in a programmable frequency divider 305 based on the amplitude control signal 7, it is possible to highly accurately control the frequency of the output signal, in addition to suppressing deterioration of temperature characteristics of phase noises, even without a temperature sensor.

Figure 13:
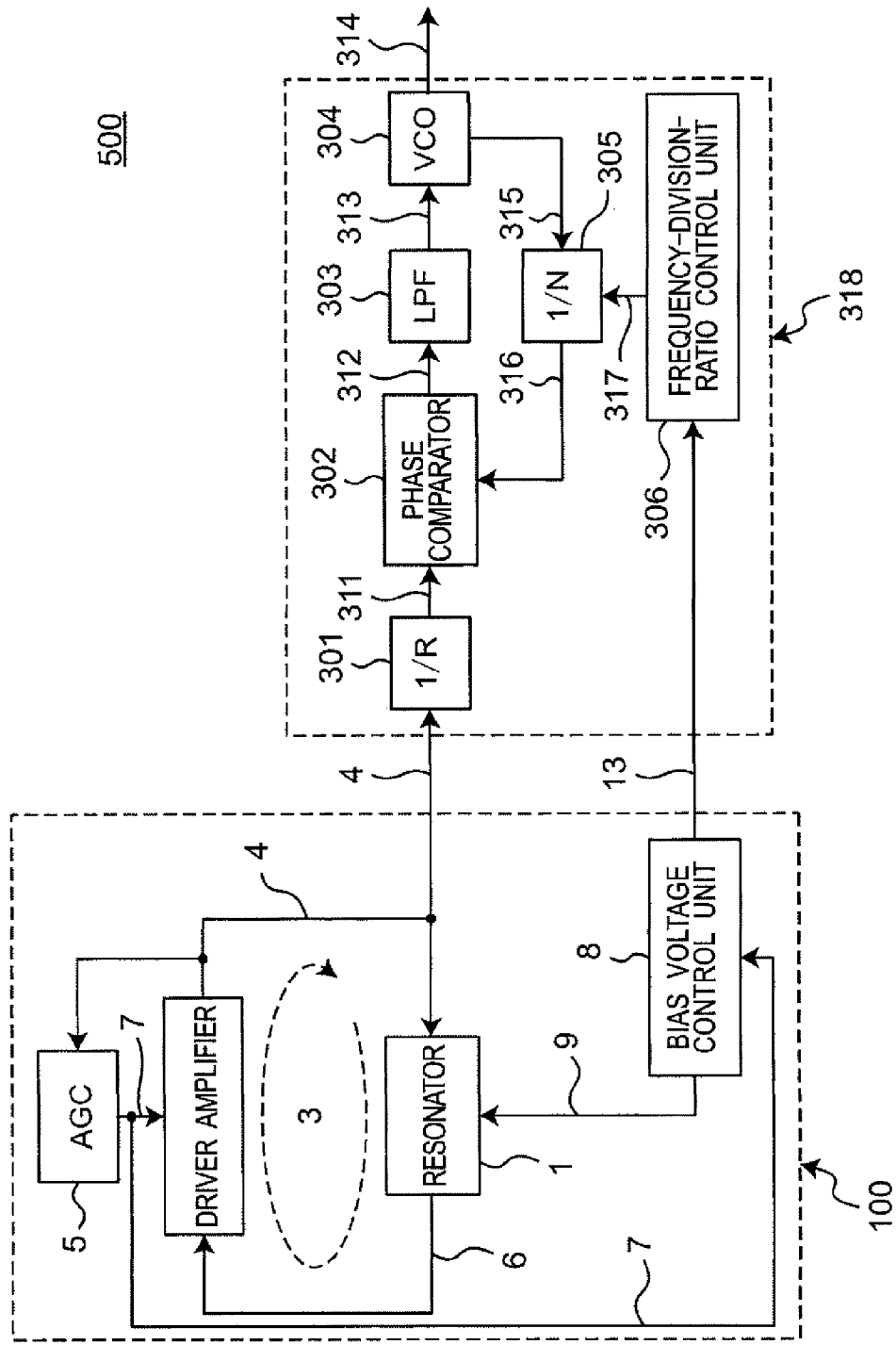
FIG. 13 is a block diagram of the structure of a MEMS oscillator according to a fifth embodiment.

FIG. 13 is a block diagram illustrating the structure of a MEMS oscillator 500 according to the present embodiment.

The MEMS oscillator 500 includes an oscillator unit 100 (having substantially the same structure as that of the MEMS oscillator 100 according to the first embodiment) adapted to output the oscillation signal 4 and, further, includes a compensation unit 318 adapted to compensate for the variation of the frequency of the oscillation signal 4 outputted from the oscillator unit 100.

The compensation unit 318 includes a frequency divider 301 adapted such that the oscillation signal 4 is inputted thereto, and a frequency synthesizer (302, 303, 304, 305) which is adapted such that a frequency division signal 311 outputted from the frequency divider 301 is inputted thereto and, further, is adapted to output an output signal (clock signal) 314. Further, the compensation unit 318 includes a frequency-division-ratio control unit 306 adapted to control the frequency division ratio in the programmable frequency divider 305 placed in the feedback section in the frequency synthesizer, based on a frequency variation information signal 13 outputted from the bias-voltage control unit 8.

The bias-voltage control unit 8 in the oscillator unit 100 is adapted to output a bias-voltage control signal 9 to the MEMS resonator 1 similarly to the first embodiment and, also, is adapted to output the magnitude of the bias voltage being currently applied to the oscillating member of the MEMS resonator 1, as the frequency variation information signal 13, to the frequency-division-ratio control unit 306 in the compensation unit 318.

The frequency-division-ratio control unit 306 derives the current operating temperature of the MEMS resonator 1, at first, based on the frequency variation information signal 13 (see FIG. 6), further calculates the current frequency of the oscillation signal 4 based on the operating temperature and the bias voltage and, further, determines the frequency division ratio in the programmable frequency divider 305 in the PLL frequency synthesizer, in such a way as to obtain the clock signal 314 having a desired frequency from the oscillation signal 4 having this frequency.

Further, information contained in the frequency variation information signal 13 is not limited to information about the magnitude of the bias voltage applied to the oscillating member of the MEMS resonator 1. For example, the bias-voltage control unit 8 can be adapted to derive the current operating temperature of the MEMS resonator 1 from the amplitude control signal 7 and to output this operating temperature as the frequency variation information signal 13. In this case, the frequency-division-ratio control unit 306 is adapted to derive the magnitude of the bias voltage applied to the oscillating member of the MEMS resonator 1 (see FIG. 6), at first, based on the frequency variation information signal 13, further to calculate the frequency of the oscillation signal 4 based on the operating temperature and the bias voltage and, further, to determine the frequency division ratio in the programmable frequency divider 305 in the PLL frequency synthesizer, in such a way as to obtain the clock signal 314 having a desired frequency from the oscillation signal 4 having this frequency.

Hereinafter, the compensation unit 318 will be described, with respect to its structure and operations, in detail.

The compensation unit 318 includes the frequency divider 301 which is adapted such that the oscillation signal 4 is inputted thereto and, further, is adapted to output a first frequency division signal 311 resulted from frequency division by 1/R multiplication. Further, the compensation unit 318 includes the frequency synthesizer which is adapted such that the first frequency division signal 311 is inputted thereto and, further, is adapted to output the clock signal 314 having a desired frequency (a PLL frequency synthesizer including: a phase comparator 302; a loop filter (low-pass filter, LPF) 303; a voltage controlled oscillator (VCO) 304; and the programmable frequency divider 305), and the frequency-division-ratio control unit 306 adapted to control the frequency division ratio in the programmable frequency divider 305 based on the frequency variation information signal 13.

The first frequency division signal 311 is inputted to the phase comparator 302, and the phase comparator 302 is adapted to make a comparison between this first frequency division signal and a second frequency division signal 316 to detect the phase difference between both the signals and, further, is adapted to output it as an error signal 312 to the loop filter 303.

The error signal 312 is inputted to the loop filter 303, and the loop filter 303 is adapted to convert it into an error signal 313, as a DC signal containing less AC components, and to output it to the voltage controlled oscillator 304.

The voltage controlled oscillator 304 is adapted to correct the oscillation frequency based on the error signal 313 and to output the clock signal 314 having a desired frequency.

The clock signal 314 is inputted to a programmable frequency divider 315, and the programmable frequency divider 315 is adapted to perform frequency division on the clock signal 314 with a frequency division ratio commanded by the frequency-division-ratio control unit 305 and, further, is adapted to output it as the second frequency division signal 316 to the phase comparator 302.

In this case, the frequency-division-ratio control unit 306 is adapted to derive the frequency of the oscillation signal 4 based on the frequency variation information signal 13 and to determine the frequency division ratio in the programmable frequency divider 305 based on this frequency, assuming that the resonance frequency fc of the MEMS resonator 1 has a temperature characteristic of −20 ppm/degree C. and, also, the resonance frequency change rate Delta-f/fc is proportional to the square of the bias voltage.

As described above, the compensation unit 318 is capable of compensating for the variation of the frequency of the oscillation signal 4 due to the change of the operating temperature, and due to the bias-voltage control by the bias-voltage control unit 8 and, therefore, is capable of highly accurately outputting the clock signal 314 having a desired frequency.

Accordingly, the MEMS oscillator 500 is capable of outputting the clock signal 314 having a desired frequency with higher accuracy, at any operating temperatures, in addition to suppressing deterioration of phase noise characteristics of the oscillation signal 4.

Further, the frequency divider 301 can, according to the relationship between the frequency of the oscillation signal 4 and the desired frequency of the clock signal 314, be constituted by a multiplier or can be eliminated.

7. Sixth Embodiment

Hereinafter, a MEMS oscillator according to a sixth embodiment will be described.

The MEMS oscillator according to the sixth embodiment is capable of highly accurately outputting a clock signal 314 having a desired frequency, by compensating for the variation of the frequency of an oscillation signal 4, similarly to the MEMS oscillator 500 according to the fifth embodiment. By doing this, the MEMS oscillator according to the present embodiment can output stable signals having less frequency variations, at any operating temperatures.

Figure 14:
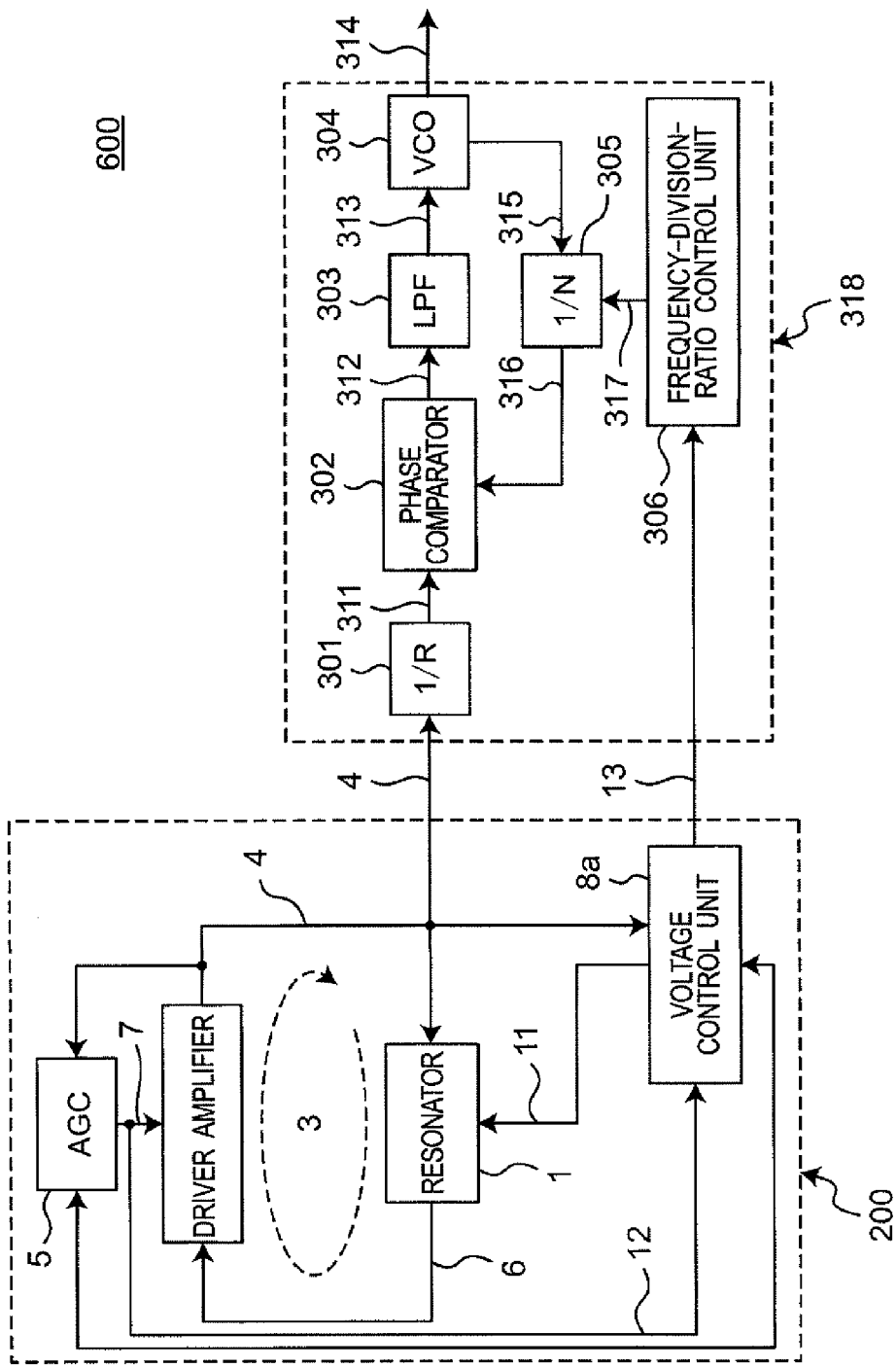
FIG. 14 is a block diagram of the structure of a MEMS oscillator according to a sixth embodiment.

FIG. 14 is a block diagram illustrating the structure of a MEMS oscillator 600 according to the present embodiment.

The MEMS oscillator 600 includes an oscillator unit 200 (having substantially the same structure as that of the MEMS oscillator 200 according to the second embodiment) adapted to output an oscillation signal 4, and a compensation unit 318 adapted to compensate for the variation of the frequency of the oscillation signal 4 outputted from the oscillator unit 200.

The compensation unit 318 can have substantially the same structure as that of the compensation unit 318 in the MEMS oscillator 500 according to the fifth embodiment and, therefore, will be described with respect to only differences therefrom, hereinafter.

The compensation unit 318 includes a frequency-division-ratio control unit 306 which is adapted to perform control based on a frequency variation information signal 13 outputted from a voltage control unit 8a.

In this case, the frequency variation information signal 13 includes information about the magnitude of the amplitude of the oscillation signal 4, in addition to information about the magnitude of the bias voltage applied to the oscillating member of the MEMS resonator 1.

The frequency-division-ratio control unit 306 is adapted to derive the current operating temperature of the MEMS resonator 1 (see FIG. 10), at first, based on the information about the magnitude of the bias voltage and the magnitude of the amplitude of the oscillation signal 4 indicated by the frequency variation information signal 13, further to calculate the current frequency of the oscillation signal 4 based on the operating temperature and the bias voltage and, further, to determine the frequency division ratio in a programmable frequency divider 305 in a PLL frequency synthesizer, in such a way as to obtain a clock signal 314 having a desired frequency from the oscillation signal 4 having this frequency.

Further, in the present embodiment, similarly, the frequency-division-ratio control unit 306 is adapted to derive the frequency of the oscillation signal 4 based on the frequency variation information signal 13 and to determine the frequency division ratio in the programmable frequency divider 305 based on this frequency, assuming that the resonance frequency fc of the MEMS resonator 1 has a temperature characteristic of −20 ppm/degree C. and, also, the resonance frequency change rate Delta-f/fc is proportional to the square of the bias voltage. The magnitude of the amplitude of the oscillation signal 4 exerts no influence on the resonance frequency fc of the MEMS resonator 1. The information about the magnitude of the amplitude of the oscillation signal 4 contained in the frequency variation information signal 13 is utilized for deriving the operating temperature of the MEMS resonator 1 within a temperature region equal to or lower than the changeover temperature 74 (FIG. 10).

As described above, the MEMS oscillator 600 is capable of outputting the clock signal 314 having a desired frequency with higher accuracy, at any operating temperatures, in addition to suppressing deterioration of phase noise characteristics of the oscillation signal 4.

8. Seventh Embodiment

Hereinafter, a MEMS oscillator according to a seventh embodiment will be described.

The MEMS oscillator according to the seventh embodiment is an oscillator which includes a temperature sensor for measuring the operating temperature of a MEMS resonator 1 and, further, is adapted to control the magnitude of a bias voltage applied to an oscillating member of the MEMS resonator 1 and the frequency division ratio in a programmable frequency divider 305, based on the operating temperature measured by the temperature sensor and, therefore, is capable of outputting output signals with excellent phase noise characteristics and with stable frequencies, at any operating temperatures.

Figure 15:
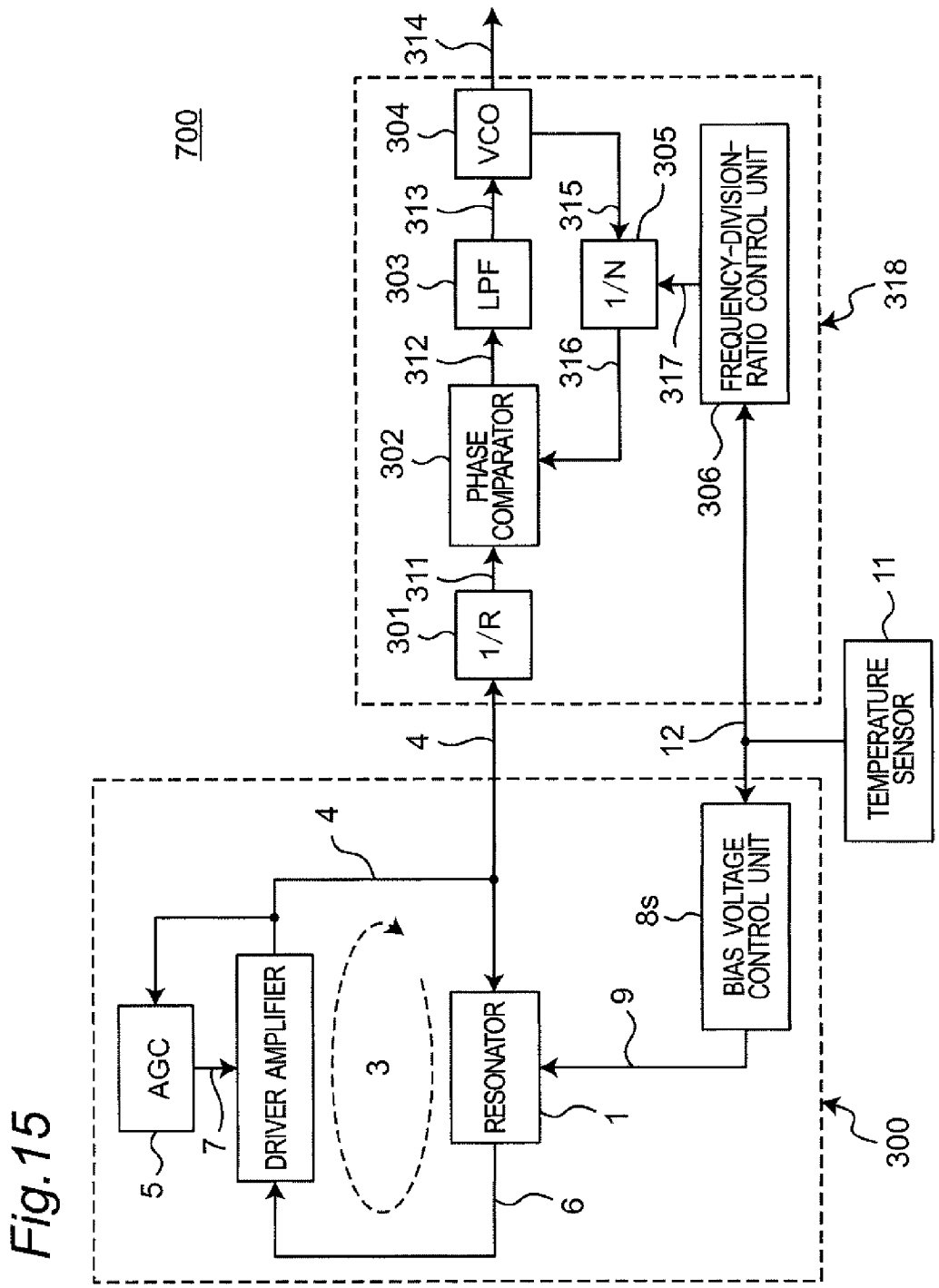
FIG. 15 is a block diagram of the structure of a MEMS oscillator according to a seventh embodiment.

FIG. 15 is a block diagram illustrating the structure of a MEMS oscillator 700 according to the present embodiment.

The MEMS oscillator 700 includes an oscillator unit 300 (having substantially the same structure as that of the MEMS oscillator 300 according to the third embodiment) adapted to output an oscillation signal 4, a temperature sensor 11 which is adapted to measure the operating temperature of the MEMS resonator 1 and, further, to output it as a temperature information signal 12 to a bias-voltage control unit 8s and a frequency-division-ratio control unit 306, and a compensation unit 318 adapted to compensate for the variation of the frequency of the oscillation signal 4 outputted from the oscillator unit 300.

The oscillator unit 300 can be the same as the MEMS oscillator 300 according to the third embodiment, in terms of its operations. Here, the description thereof will not be given.

The frequency-division-ratio control unit 306 is adapted to derive the magnitude of the bias voltage applied to the oscillating member of the MEMS resonator 1 (see FIG. 6), at first, based on the temperature information signal 12, further to calculate the frequency of the oscillation signal 4 based on the operating temperature and the bias voltage and, further, to determine the frequency division ratio in the programmable frequency divider 305 in a PLL frequency synthesizer, in such a way as to obtain a clock signal 314 having a desired frequency from the oscillation signal 4 having this frequency.

As described above, the compensation unit 318 is capable of compensating for the variation of the frequency of the oscillation signal 4 due to the change of the operating temperature, and due to the bias-voltage control by the bias-voltage control unit 8s and, therefore, is capable of highly accurately outputting the clock signal 314 having a desired frequency.

Accordingly, the MEMS oscillator 700 is capable of outputting the clock signal 314 having a desired frequency with higher accuracy, at any operating temperatures, in addition to suppressing deterioration of phase noise characteristics of the oscillation signal 4.

9. Eighth Embodiment

Hereinafter, a MEMS oscillator according to an eighth embodiment will be described.

The MEMS oscillator according to the eighth embodiment is an oscillator which includes a temperature sensor for measuring the operating temperature of a MEMS resonator 1 and, further, is adapted to control the magnitude of a bias voltage applied to an oscillating member of the MEMS resonator 1, the magnitude of the amplitude of an oscillation signal 4 and the frequency division ratio in a programmable frequency divider 305, based on the operating temperature measured by the temperature sensor and, therefore, is capable of outputting output signals with excellent phase noise characteristics and with stable frequencies, at any operating temperatures.

Figure 16:
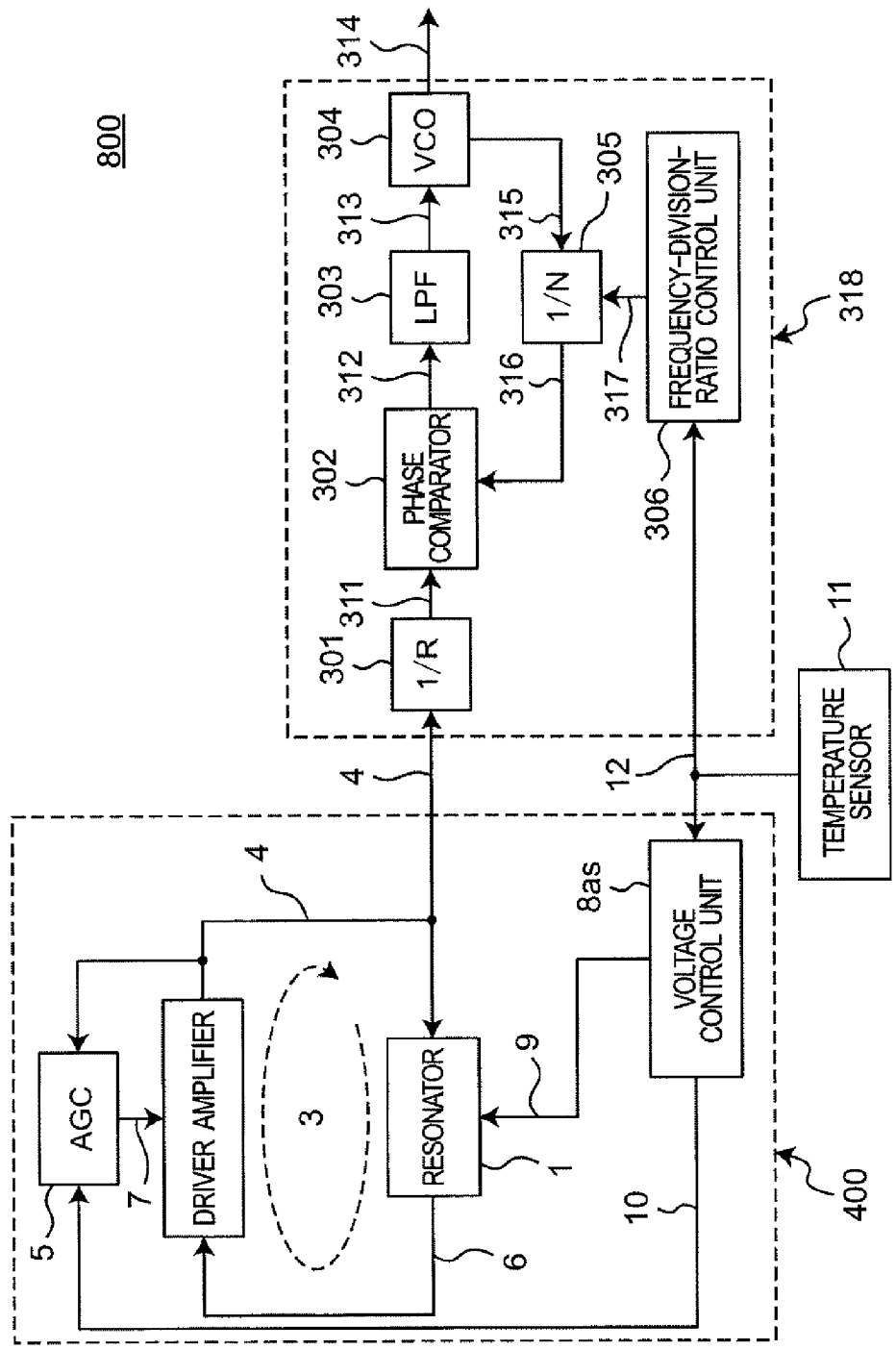
FIG. 16 is a block diagram of the structure of a MEMS oscillator according to an eighth embodiment.

FIG. 16 is a block diagram illustrating the structure of a MEMS oscillator 800 according to the present embodiment.

The MEMS oscillator 800 includes an oscillator unit 400 (having substantially the same structure as that of the MEMS oscillator 400 according to the fourth embodiment) adapted to output an oscillation signal 4, a temperature sensor 11 which is adapted to measure the operating temperature of the MEMS resonator 1 and to output it as a temperature information signal 12 to a bias-voltage control unit 8s and a frequency-division-ratio control unit 306, and a compensation unit 318 adapted to compensate for the variation of the frequency of the oscillation signal 4 outputted from the oscillator unit 400.

The oscillator unit 400 is the same as the MEMS oscillator 400 according to the fourth embodiment, in terms of its operations. Hereinafter, the description thereof will not be given.

The frequency-division-ratio control unit 306 is adapted to derive the magnitude of the bias voltage applied to the oscillating member of the MEMS resonator 1 (see FIG. 10), at first, based on the temperature information signal 12, further to calculate the frequency of the oscillation signal 4 based on the operating temperature and the bias voltage and, further, to determine the frequency division ratio in the programmable frequency divider 305 in a PLL frequency synthesizer, in such a way as to obtain a clock signal 314 having a desired frequency from the oscillation signal 4 having this frequency.

As described above, the compensation unit 318 is capable of compensating for the variation of the frequency of the oscillation signal 4 due to the change of the operating temperature, and due to the bias-voltage control by the bias-voltage control unit 8s and, therefore, is capable of highly accurately outputting the clock signal 314 having a desired frequency.

Accordingly, the MEMS oscillator 700 is capable of outputting the clock signal 314 having a desired frequency with higher accuracy, at any operating temperatures, in addition to suppressing deterioration of phase noise characteristics of the oscillation signal 4.

INDUSTRIAL APPLICABILITY

The MEMS oscillators according to the embodiments are usable as an oscillator having excellent phase noise characteristics.

REFERENCE SIGNS LIST

1: MEMS resonator
2: Driver amplifier
5: Auto gain control unit
5a: Peak hold unit
5b: Comparator unit
8: Bias voltage control unit
8a: Voltage control unit
8as: Voltage control unit
8s: Bias voltage control unit
11: Temperature sensor
100: MEMS oscillator according to the first embodiment (oscillator unit according to the fifth embodiment)
200: MEMS oscillator according to the second embodiment (oscillator unit according to the sixth embodiment)
300: MEMS oscillator according to the third embodiment (oscillator unit according to the seventh embodiment)
301: First frequency divider
302: Phase comparator
303: Loop filter
304: Voltage controlled oscillator
305: Programmable frequency divider (second frequency divider)
306: Frequency-division-ratio control unit
400: MEMS oscillator according to the fourth embodiment (oscillator unit according to the eighth embodiment)
500: MEMS oscillator according to the fifth embodiment
600: MEMS oscillator according to the sixth embodiment
700: MEMS oscillator according to the seventh embodiment
800: MEMS oscillator according to the eighth embodiment
999: Conventional MEMS oscillator
1000: MEMS oscillator in Patent Literature 1
1001: MEMS resonator
1001a: Input electrode
1001b: Oscillating member
1001c: Output electrode
1002: Driver amplifier
1005: Auto gain control unit

The invention claimed is:

1. A MEMS oscillator comprising:
a feedback-type oscillation circuit including a MEMS resonator and an amplifier;
a voltage control unit operable to control a bias voltage applied to an oscillating member of the MEMS resonator; and
an auto gain control unit operable to receive an output from the amplifier and to output, to the amplifier, based on a level of the output from the amplifier, an amplitude control signal for increasing or decreasing a gain of the amplifier such that the level of the output from the amplifier comes to be a predetermined level, for controlling the gain of the amplifier;
wherein the voltage control unit controls the bias voltage applied to the oscillating member of the MEMS resonator based on an operating temperature of the MEMS resonator such that a peak gain of the MEMS resonator comes to have a predetermined value regardless of a level of the operating temperature, and
the voltage control unit derives the operating temperature of the MEMS resonator, by monitoring the amplitude control signal.

2. A MEMS oscillator comprising:
a feedback-type oscillation circuit including a MEMS resonator and an amplifier;
a voltage control unit operable to control a bias voltage applied to an oscillating member of the MEMS resonator; and
an auto gain control unit operable to receive an output from the amplifier and to output, to the amplifier, based on a level of the output from the amplifier, an amplitude control signal for increasing or decreasing a gain of the amplifier such that the level of the output from the amplifier comes to be a predetermined level, for controlling the gain of the amplifier;
wherein the voltage control unit controls the bias voltage applied to the oscillating member of the MEMS resonator based on an operating temperature of the MEMS resonator such that a peak gain of the MEMS resonator comes to have a predetermined value regardless of a level of the operating temperature, and the MEMS oscillator further includes a temperature sensor operable to measure the operating temperature of the MEMS resonator and to output a result of the measurement, the result of the measurement of the operating temperature outputted from the temperature sensor is inputted to the voltage control unit, and the voltage control unit uses the result of the measurement as the operating temperature of the MEMS resonator.

3. The MEMS oscillator according to claim 1, wherein the MEMS oscillator performs control such that the peak gain of the MEMS resonator comes to have a predetermined value, regardless of the level of the operating temperature, by controlling the bias voltage applied to the oscillating member of the MEMS resonator through the voltage control unit or by controlling the auto gain control unit, based on the operating temperature of the MEMS resonator.

4. The MEMS oscillator according to claim 3, wherein the voltage control unit controls the bias voltage applied to the oscillating member of the MEMS resonator such that the peak gain of the MEMS resonator comes to have a predetermined value regardless of the level of the operating temperature, when the operating temperature of the MEMS resonator is higher than a predetermined temperature, and the voltage control unit controls the bias voltage such that the bias voltage comes to have a constant value regardless of the level of the operating temperature and controls the auto gain control unit such that a level of a feed-back signal comes to be a predetermined level regardless of the level of the operating temperature, when the operating temperature of the MEMS resonator is lower than the predetermined temperature.

5. The MEMS oscillator according to claim 4, wherein when the operating temperature of the MEMS resonator is higher than a predetermined temperature, the voltage control unit performs control, in such a way as to cause the level of the feed-back signal to have the same value as that of a signal level at the predetermined temperature and as to increase the bias voltage to above the bias voltage at the predetermined temperature, and when the operating temperature of the MEMS resonator is lower than a predetermined temperature, the voltage control unit performs control, in such a way as to cause the bias voltage to have the same value as the bias voltage at the predetermined temperature and to decrease the level of the feed-back signal to below the signal level at the predetermined temperature.

6. The MEMS oscillator according to claim 1, further comprising:
a PLL frequency synthesizer unit operable to receive an output of the amplifier and to output an output signal; and
a frequency-division-ratio control unit operable to control a frequency division ratio of a programmable frequency divider placed in a feedback section in the PLL frequency synthesizer unit, based on the operating temperature of the MEMS resonator and the bias voltage applied to the oscillating member of the MEMS resonator,
wherein the frequency-division-ratio control unit controls the frequency division ratio of the programmable frequency divider, such that the output signal has a predetermined frequency, regardless of the levels of the operating temperature and the bias voltage.

7. The MEMS oscillator according to claim 2, wherein the MEMS oscillator performs control such that the peak gain of the MEMS resonator comes to have a predetermined value, regardless of the level of the operating temperature, by controlling the bias voltage applied to the oscillating member of the MEMS resonator through the voltage control unit or by controlling the auto gain control unit, based on the operating temperature of the MEMS resonator.

8. The MEMS oscillator according to claim 7, wherein the voltage control unit controls the bias voltage applied to the oscillating member of the MEMS resonator such that the peak gain of the MEMS resonator comes to have a predetermined value regardless of the level of the operating temperature, when the operating temperature of the MEMS resonator is higher than a predetermined temperature, and the voltage control unit controls the bias voltage such that the bias voltage comes to have a constant value regardless of the level of the operating temperature and controls the auto gain control unit such that a level of a feed-back signal comes to be a predetermined level regardless of the level of the operating temperature, when the operating temperature of the MEMS resonator is lower than the predetermined temperature.

9. The MEMS oscillator according to claim 8, wherein when the operating temperature of the MEMS resonator is higher than a predetermined temperature, the voltage control unit performs control, in such a way as to cause the level of the feed-back signal to have the same value as that of a signal level at the predetermined temperature and as to increase the bias voltage to above the bias voltage at the predetermined temperature, and when the operating temperature of the MEMS resonator is lower than a predetermined temperature, the voltage control unit performs control, in such a way as to cause the bias voltage to have the same value as the bias voltage at the predetermined temperature and to decrease the level of the feed-back signal to below the signal level at the predetermined temperature.

10. The MEMS oscillator according to claim 2, further comprising:
a PLL frequency synthesizer unit operable to receive an output of the amplifier and to output an output signal; and
a frequency-division-ratio control unit operable to control a frequency division ratio of a programmable frequency divider placed in a feedback section in the PLL frequency synthesizer unit, based on the operating temperature of the MEMS resonator and the bias voltage applied to the oscillating member of the MEMS resonator,
wherein the frequency-division-ratio control unit controls the frequency division ratio of the programmable frequency divider, such that the output signal has a predetermined frequency, regardless of the levels of the operating temperature and the bias voltage.

* * * * *